United States Patent
Tatemichi et al.

(10) Patent No.: US 9,608,057 B2
(45) Date of Patent: Mar. 28, 2017

(54) SEMICONDUCTOR DEVICE AND METHOD FOR MANUFACTURING SEMICONDUCTOR DEVICE

(71) Applicant: FUJI ELECTRIC CO., LTD., Kawasaki-shi (JP)

(72) Inventors: Shuhei Tatemichi, Matsumoto (JP); Takeyoshi Nishimura, Matsumoto (JP); Yasushi Niimura, Matsumoto (JP); Masanori Inoue, Ina (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 0 days.

(21) Appl. No.: 15/067,279

(22) Filed: Mar. 11, 2016

(65) Prior Publication Data

US 2016/0197140 A1 Jul. 7, 2016

Related U.S. Application Data

(62) Division of application No. 14/054,277, filed on Oct. 15, 2013, now Pat. No. 9,331,194.

(30) Foreign Application Priority Data

Oct. 18, 2012 (JP) .................................. 2012-230835
Mar. 21, 2013 (JP) .................................. 2013-059111

(51) Int. Cl.
*H01L 21/336* (2006.01)
*H01L 29/06* (2006.01)
*H01L 29/78* (2006.01)
*H01L 29/739* (2006.01)
*H01L 29/10* (2006.01)
(Continued)

(52) U.S. Cl.
CPC .......... *H01L 29/063* (2013.01); *H01L 21/266* (2013.01); *H01L 21/26513* (2013.01); *H01L 29/1045* (2013.01); *H01L 29/1095* (2013.01); *H01L 29/66333* (2013.01);
(Continued)

(58) Field of Classification Search
None
See application file for complete search history.

(56) References Cited

U.S. PATENT DOCUMENTS 4,837,606 A   6/1989  Goodman et al.
4,849,367 A   7/1989  Rouault et al.
(Continued)

FOREIGN PATENT DOCUMENTS

JP    S62-266871 A    11/1987
JP    H01-096962 A    4/1989
(Continued)

*Primary Examiner* — John C Ingham
(74) *Attorney, Agent, or Firm* — Rabin & Berdo, P.C.

(57) ABSTRACT

A MOS semiconductor device has a MOS structure, including a $p^-$ region that surrounds an $n^+$-type source region and has a net doping concentration lower than a concentration of a p-type impurity in a surface of a p-type well region, and a gate electrode that is provided on top of the surface of the p-type well region sandwiched between the $n^+$-type source region and a surface layer of an $n^-$ layer, with a gate insulator disposed between the p-type well region and the gate electrode. This configuration can make the gate insulator thicker without increasing a gate threshold voltage, and help improve the reliability of the gate insulator and reduce the gate capacitance.

12 Claims, 42 Drawing Sheets

(51) Int. Cl.
    *H01L 21/265*    (2006.01)
    *H01L 29/66*     (2006.01)
    *H01L 21/266*    (2006.01)

(52) U.S. Cl.
    CPC .... *H01L 29/66712* (2013.01); *H01L 29/7395* (2013.01); *H01L 29/78* (2013.01); *H01L 29/7802* (2013.01)

(56) References Cited

U.S. PATENT DOCUMENTS

| | | |
|---|---|---|
| 5,218,220 A | 6/1993 | Neilson et al. |
| 5,589,405 A | 12/1996 | Contiero et al. |
| 5,701,023 A | 12/1997 | Bulucea et al. |
| 5,917,219 A | 6/1999 | Nandakumar et al. |
| 6,093,948 A | 7/2000 | Zambrano et al. |
| 6,380,045 B1 | 4/2002 | Guo |
| 6,501,128 B1 | 12/2002 | Otsuki |
| 6,677,208 B2 | 1/2004 | Mehrotra et al. |
| 6,781,194 B2 | 8/2004 | Baliga |
| 7,968,415 B2 | 6/2011 | Nandakumar |
| 2005/0179082 A1 | 8/2005 | Miyata et al. |

FOREIGN PATENT DOCUMENTS

| | | |
|---|---|---|
| JP | H04-125972 A | 4/1992 |
| JP | H06-005865 A | 1/1994 |
| JP | H06-504882 A | 6/1994 |
| JP | H06-244428 A | 9/1994 |
| JP | H07-249760 A | 9/1995 |
| JP | 2001-024184 A | 1/2001 |
| JP | 2005-229066 A | 8/2005 |
| JP | 2010-272741 A | 12/2010 |

SEMICONDUCTOR DEVICE AND METHOD FOR MANUFACTURING SEMICONDUCTOR DEVICE

CROSS REFERENCE TO RELATED APPLICATION

This application is a divisional of application Ser. No. 14/054,277, filed on Oct. 15, 2013, and allowed on Jan. 5, 2016. Furthermore, this application claims the benefit of priority of Japanese applications 2012-230835, filed on Oct. 18, 2012, and 2013-059111, filed on Mar. 21, 2013. The disclosures of these prior U.S. and Japanese applications are incorporated herein by reference.

BACKGROUND

Technical Field

The present invention relates to a MOS-type (metal oxide semiconductor) semiconductor device such as an insulated gate field-effect transistor (MOSFET) or insulated gate bipolar transistor (IGBT), and a method for manufacturing the semiconductor device.

Background Art

A surface MOS structure of a power MOSFET, one of the conventional general MOS-type semiconductor devices, is now described. FIG. 4 is a cross-sectional diagram showing substantial parts of a surface MOS structure of a conventional MOSFET. FIG. 5 is a characteristic diagram showing a distribution of impurity concentrations in regions disposed along line $A_1$-$A_2$ in FIG. 4, the distribution being obtained when concentration compensation is not performed at a region boundary. FIG. 6 is a characteristic diagram showing a distribution of impurity concentrations in the regions disposed along line $A_1$-$A_2$ of FIG. 4, the distribution being obtained when concentration compensation is performed at a region boundary. FIG. 5 illustrates a concentration distribution of an impurity which is a dopant placed in each of the regions such as an $n^+$-type source region 4, a channel forming region 10 within a p-type well region 3, and an $n^-$ layer configuring a semiconductor substrate, which are adjacent to one another along the line $A_1$-$A_2$ extending horizontally on the main surface, the surface layer of the semiconductor substrate having the surface MOS structure of the MOSFET shown in FIG. 4. FIG. 6 shows a net doping concentration distribution of a donor and an acceptor in each of the regions adjacent to one another along the line $A_1$-$A_2$. The numbers (reference numerals 4, 10, 2) described in an upper part of the frame of each of the graphs shown in FIGS. 5 and 6 represent the regions, which are denoted by the same reference numerals in FIG. 4, and FIGS. 5 and 6 show respectively an impurity concentration distribution and a doping concentration distribution of the regions corresponding to these numbers.

As shown in FIG. 4, the front surface side of the semiconductor substrate configuring an $n^-$ layer 2 has a surface MOS structure in which a gate electrode 7, made of polysilicon, is disposed on a surface of the channel forming region 10, with a gate insulator 6 therebetween, the channel forming region 10 being a part of the p-type well region 3 that is sandwiched between the $n^+$-type source region 4 and the surface layer of an $n^-$ layer 2. ON/OFF control of the main current in the power MOSFET is performed by applying a voltage to the gate electrode 7 provided on the surface of the channel forming region 10 with the gate insulator 6 therebetween, and then inverting the conductivity type of the channel forming region 10 to the n-type. A gate threshold voltage of a general power MOSFET is set at approximately 1.0 V to 5.0 V. The thickness of the gate insulator 6 is set at approximately 500 to 1200 Å so that the gate threshold voltage in the abovementioned range is obtained.

In this surface MOS structure, because the length of the channel forming region 10 in the p-type well region 3 (the distance between the $n^+$-type source region 4 and the surface layer of the $n^-$ layer 2 in the p-type well region 3, i.e., the distance in which the main current flows: channel length), the impurity concentration in the surface of the channel forming region 10, the film thickness of the gate insulator 6, and the like have a direct impact on the characteristics of an on-resistance and the characteristics of a gate threshold voltage, these components are the key components in designing the device. In other words, the channel forming region 10 is formed with care so that the main current flows evenly within an active part of the semiconductor substrate (chip) of the MOSFET and that the channel length, the surface impurity concentration and the like are kept balanced. The active part is a region in which the main current flows when the semiconductor device is in the ON state.

As a method for keeping the channel length balanced and forming each of the regions with high dimensional accuracy, there is known a method for forming each of the regions by self-alignment. A method for manufacturing (preparing) a conventional MOSFET in which the $n^+$-type source region 4 is formed in the p-type well region 3 by self-alignment, is schematically described with reference to FIGS. 23 to 31. FIGS. 23 to 31 are cross-sectional diagrams of substantial parts of a semiconductor substrate, each showing sequentially the steps of manufacturing a surface MOS structure of a conventional MOSFET. FIGS. 23 to 31 are process drawings of cross sections of an element, showing a method for manufacturing a MOSFET according to Patent Document 1 (identified further on).

First, an insulator 31 on a front surface of an n-type silicon substrate 30 is patterned into a required opening for a p-type well region to form a mask for the insulator 31, and then a thin screen oxide film 32 is formed on the n-type silicon substrate 30. Then, masking with this mask for the insulator 31, p-type impurity ions are implanted through the screen oxide film 32 (FIG. 23). The p-type impurity is then diffused by heat, to form a p-type well region 33 on the surface layer of the n-type silicon substrate 30 (FIG. 24).

Next, a resist mask 34a having an open region for forming a $p^+$ contact region is formed on the insulator 31 and the screen oxide film 32. Masking with the resist mask 34a, ion implantation 35 is carried out to implant boron (B) through the screen oxide film 32 (FIG. 25), to form a $p^+$ contact region 36 inside the p-type well region 33 (FIG. 26). Subsequently, the resist mask 34a is removed. Thereafter, a resist mask 34b for forming an $n^+$-type source region is formed on the screen oxide film 32, and an opening 39a is formed on the resist mask 34b to expose the area for forming an $n^+$-type source region (FIG. 27).

Next, masking with the resist mask 34b and the insulator 31, arsenic (As) ions are implanted through the screen oxide film 32, and then the resist mask 34b is peeled off. The implanted arsenic ions are then annealed to form an $n^+$-type source region 39 across a surface layer of the p-type well region 33 on the substrate front surface side and a surface layer of the $p^+$ contact region 36 on the substrate front surface side (FIG. 28). With the use of the same mask for the insulator 31, the positional relationship between the p-type well region 33 and the $n^+$-type source region 39 becomes constant due to self-alignment thereof.

Thereafter, the mask for the insulator 31 is removed (FIG. 29), and a gate insulator 37 is formed on the front surface of the n-type silicon substrate 30 by thermal oxidation (FIG. 30). A polysilicon film is formed on this gate insulator 37 and etched into a required pattern, to form the gate insulator 37 and a gate electrode 38 (FIG. 31). Thereafter, a general method is used to form remaining front surface element structures on the front surface of the n-type silicon substrate 30, such as an interlayer insulator and a source electrode (not shown), as well as a drain electrode (not shown) on the rear surface of the n-type silicon substrate 30. As a result, the conventional MOSFET is completed.

Another example of the method for manufacturing a conventional MOSFET is schematically described with reference to FIGS. 32 to 38, the method including a self-alignment step. FIGS. 32 to 38 are cross-sectional diagrams of substantial parts of a semiconductor substrate, each showing sequentially the other examples of steps of manufacturing a surface MOS structure of a conventional MOSFET. FIGS. 32 to 38 are process drawings of cross sections of an element, each showing a method for manufacturing a MOSFET according to Patent Document 2 (identified further on). First, a gate insulator 37 is formed on the front surface of an n-type silicon substrate 30. Subsequently, a polysilicon film is formed on the gate insulator 37 and etched into a required pattern, thereby forming the gate insulator 37 and a gate electrode 38.

Masking with the gate electrode 38, boron ions are implanted through the gate insulator 37 (FIG. 32), to form a p-type well region 33 on a surface layer of the front surface of the n-type silicon substrate 30 (FIG. 33). This method for manufacturing a conventional MOSFET is different from the method for manufacturing a conventional MOSFET that is previously described, in that the p-type well region 33 is formed by masking with the gate electrode 38 that is formed prior to forming the p-type well region 33. Next, as shown in FIGS. 34 to 38, a $p^+$ contact region 36 and an $n^+$-type source region 39 are formed using the same steps as those of the previously described method for manufacturing a conventional MOSFET. As a result, a surface MOS structure is obtained. Reference numeral 34a shown in FIG. 34 represents a resist mask for forming the $p^+$ contact region 36. Reference numeral 34b shown in FIG. 36 represents a resist mask for forming the $n^+$-type source region 39.

This method for using the gate electrode 38 as a mask and forming the p-type well region 33 and the $n^+$-type source region 39 by self-alignment is widely used in vertical MOS gate-type elements (MOS semiconductor devices). A vertical MOS gate-type element is an element that uses a MOS gate to control the current flowing vertically from one of the surfaces of a semiconductor substrate to the other surface. Examples of such an element include a power MOSFET and an insulated gate bipolar transistor (IGBT).

These two methods for manufacturing a surface MOS structure of a conventional MOSFET are common in that the p-type well region 33 and the $n^+$-type source region 39 are formed by self-alignment. It is important to form the p-type well region 33 and the $n^+$-type source region 39 by self-alignment in order to make the channel length (the distance in which the main current flows) uniform.

With regard to a gate threshold voltage, it is known that the film thickness of a gate insulator and the impurity concentration in a p-type well region have the following relationship. Reducing the impurity concentration in the surface of the p-type well region can reduce the impurity concentration in an area of the p-type well region in the vicinity of the $n^+$-type source region where a channel is formed, resulting in reducing the gate threshold voltage. However, the risk in such a relationship is that conduction of a parasitic transistor is made easily during the ON state of the semiconductor device due to the reduced impurity concentration in the channel forming region, resulting in not being able to control the gate. In addition, because the p-type well region is formed by thermal diffusion, reducing the impurity concentration in the channel forming region can further lower the impurity concentration in a part of the p-type well region other than the channel forming region according to a Gaussian distribution. Consequently, a depletion layer easily expands in the p-type well region during the OFF state of the semiconductor device, which can result in damaging the semiconductor device by punch-through.

On the other hand, the thicker the film thickness of the gate insulator, the greater the gate threshold voltage. However, it is preferred that the gate insulator be thick in terms of improving dielectric breakdown withstand capability of the gate insulator itself (referred to as "gate breakdown withstand capability," hereinafter) and reducing the gate capacity (i.e., reducing the switching loss). When the impurity concentration in the surface of the channel forming region is high, a high electric field (high gate threshold voltage) is required in order to reverse the conductivity type of the channel forming region upon application of a gate voltage. However, when the design range of the gate threshold voltage is restricted to approximately 1.0 V to 5.0 V as described above, the gate insulator cannot be made thicker than 1200 Å. Moreover, it is preferred that the gate threshold voltage be made low for the purpose of reducing dielectric breakdown of the gate insulator.

As a MOS semiconductor device that is configured to reduce the impurity concentration of a channel forming region in relation to a p-type well region (p-base region), there is proposed a power FET that has a surface-side region of a p-base region where a channel is formed and a lower region constituting the remaining part of the p-base region, wherein a gate threshold voltage is reduced while lowering the impact of a parasitic transistor, by reducing the impurity concentration in the surface-side region of the p-base region and increasing the impurity concentration in the lower region of the same (see Patent Document 3, identified further on, for example).

The following method is proposed as a method for reducing a gate capacity. Of the film thickness of a gate insulator, the film thickness of a part corresponding to the center of a semiconductor substrate region sandwiched between p-base regions is made as thick as 6000 Å, and the film thickness of the surrounding area is made as thin as 500 to 1200 Å. Masking with this gate insulator, a donor impurity is doped through the thin part of the gate insulator. In this manner, an n-type region that has an impurity concentration higher than that of the front surface of the semiconductor substrate is formed only below the thin part of the gate insulator, into a thickness greater than the thickness of a source region and a depth shallower than the depth of a p well region (see Patent Document 4, identified further on, for example).

As a method for adjusting a gate threshold voltage while preventing a depletion layer from being a punch-through state, there is proposed a method for forming a pocket region having a peak concentration higher than that of an n-type substrate region, between the n-type substrate region and a high-concentration p-type source region by implanting n-type impurity ions prior to forming a gate electrode and, prior to or after forming the high-concentration p-type source region by introducing a p-type impurity to an upper part of the n-type substrate region (see Patent Document 5, identified further on, for example). In Patent Document 5, ions of the same conductivity type as that of the n-type substrate region are implanted into a part of the n-type substrate region (well region) in the vicinity of the gate insulator, to selectively form a high-concentration region in contact with the source region and increase the gate threshold voltage.

Patent Document 1: Japanese Patent Application Publication No. H6-244428

Patent Document 2: Japanese Patent Application Publication No. H6-5865

Patent Document 3: Japanese Translation of PCT Application No. H6-504882

Patent Document 4: Japanese Patent Application Publication No. H4-125972

Patent Document 5: Japanese Patent Application Publication No. 2005-229066

As described previously, the film thickness of a gate insulator of a MOSFET and the impurity concentration in a p-type well region are in a trade-off relationship with respect to a gate threshold voltage. In addition, increasing the film thickness of the gate insulator of the MOSFET can help improve the gate breakdown withstand capability and reduce the gate capacitance.

Although increasing the film thickness of the gate insulator increases a gate threshold voltage as described above, there is a limit to increasing the film thickness of the gate insulator. Furthermore, the gate threshold voltage of the MOSFET is determined based on the film thickness of the gate insulator and the impurity concentration in the surface of the channel forming region located outside the $n^+$-type source region inside the p-type well region. In addition, since the channel forming region configures a current path for the main current, the p-type well region and the $n^+$-type source region are formed by self-alignment so that the distance therebetween (channel length) becomes constant in order to keep the resistance constant in the current path in the conventional methods described in Patent Documents 1 to 5.

In the channel forming region 10 of the conventional MOSFET formed by these methods (FIG. 4), the distribution of impurity concentrations in the p-type well region 3 and the $n^+$-type source region 4 has an inclination where the impurity concentrations gradually decrease in accordance with the depth of the semiconductor substrate from the ion implantation region (surface) on the front surface side of the substrate. In this case, the gate threshold voltage is determined based on the impurity concentration in the surface of the p-type well region 3 in the vicinity of the joint between the p-type well region 3 and the $n^+$-type source region 4.

Therefore, even when the film thickness of the gate insulator is increased, increase of the gate threshold voltage can be suppressed by reducing the impurity concentration in the surface of the p-type well region in the vicinity of the joint between the p-type well region 3 and the $n^+$-type source region 4. However, the impurity concentration in the surface of the p-type well region is closely related to the withstand voltage and on-resistance of the semiconductor device, there is no choice but setting the impurity concentration within a range not affecting the withstand voltage and on-resistance negatively. For this reason, there is a limit to a lower limit of the gate threshold voltage that can be adjusted by reducing the impurity concentration in the surface of the p-type well region, as well as to increasing the film thickness of the gate insulator determined based on the gate threshold voltage. In Patent Document 5, the gate threshold voltage can only be increased because the gate threshold voltage is adjusted by forming a high-concentration region in the well region by implanting ions of the same conductivity type as that of the well region. Another problem with Patent Document 5 is that reducing the impurity concentration in the p-type well region allows a depletion layer to spread, consequently causes a short channel effect, and enables operation of a parasitic bipolar transistor.

SUMMARY

The present invention was contrived in order to overcome these problems of the prior arts, and an object thereof is to provide a semiconductor device in which a p-type well region and an $n^+$-type source region can be formed by self-alignment, and which has a low gate threshold voltage and high gate breakdown withstand capability, and a method for manufacturing such a semiconductor device. Also, in order to overcome these problems of the prior arts, another object of the present invention is to provide a semiconductor device for reducing switching losses and a method for manufacturing such a semiconductor device.

In order to solve these problems and achieve the objects of the present invention, a semiconductor device according to the present invention has the following features. In other words, a surface layer of one of main surfaces of a first conductivity-type drift layer composed of a first conductivity-type semiconductor substrate is provided selectively with a second conductivity-type well region. A first conductivity-type source region is provided selectively inside the second conductivity-type well region. A second conductivity-type low-concentration region, which has a net doping concentration lower than a concentration of a second conductivity-type impurity contained in the second conductivity-type well region, is provided selectively inside the second conductivity-type well region in such a manner as to surround the first conductivity-type source region. A gate electrode is provided on surfaces of the first conductivity-type source region, the second conductivity-type low-concentration region, the second conductivity-type well region, and the first conductivity-type drift layer, with a gate insulator interposed between the gate electrode and the surfaces. The first conductivity-type source region, the second conductivity-type low-concentration region, and the gate electrode constitute an insulated gate structure.

In a semiconductor device of the present invention, according to the invention mentioned above, in the second conductivity-type low-concentration region the concentration of the second conductivity-type impurity may be compensated by a concentration of a first conductivity-type impurity contained in the first conductivity-type semiconductor substrate, in such a manner that the concentration of the second conductivity-type impurity decreases from one of the main surfaces of the first conductivity-type semiconductor substrate toward the other one of the main surfaces. Furthermore, in a semiconductor device of the present invention, according to the invention mentioned above, the first conductivity-type impurity may be phosphorus.

In order to solve the problems of the prior arts and achieve the objects of the present invention, a method for manufacturing a semiconductor device according to the present invention has the following features. In other words, first, a first forming step is carried out to selectively form an insulator on one of main surfaces of a first conductivity-type semiconductor substrate constituting a first conductivity-type drift layer. Next, a second forming step is carried out to selectively form a second conductivity-type well region on one of the main surfaces of the first conductivity-type semiconductor substrate by implanting ions of a second conductivity-type impurity, with the insulator serving as a mask, and diffusing the second conductivity-type impurity by heat. Subsequently, a first mask forming step is carried out to form a first resist mask that has a first opening for selectively exposing the second conductivity-type well region between the insulator and the first resist mask. An ion implantation step is then carried out to ion-implant two types of first conductivity-type impurities having mutually different diffusion coefficients, into the second conductivity-type well region through the first opening by using the insulator and the first resist mask as masks. Thereafter, an annealing step is carried out to form a first conductivity-type source region and a second conductivity-type low-impurity-concentration region by diffusing the two types of first conductivity-type impurities having mutually different diffusion coefficients by means of annealing. Then, a third forming step is carried out to form a gate insulator on one of the main surfaces of the first conductivity-type semiconductor substrate. Subsequently, a fourth forming step is carried out to form a gate electrode on surfaces of the first conductivity-type source region, the second conductivity-type low-impurity-concentration region, the second conductivity-type well region, and the first conductivity-type drift layer, with the gate insulator interposed between the gate electrode and the surfaces.

In order to solve the problems of the prior arts and achieve the objects of the present invention, a method for manufacturing a semiconductor device according to the present invention has the following features. First, a first forming step is carried out to form a gate insulator on one of main surfaces of a first conductivity-type semiconductor substrate. Next, a second forming step is carried out to form a gate electrode on a surface of the gate insulator by patterning a polysilicon film. Subsequently, a third forming step is carried out to selectively form a second conductivity-type well region on one of the main surfaces of the first conductivity-type semiconductor substrate by ion-implanting a second conductivity-type impurity, with the gate electrode serving as a mask, and diffusing the second conductivity-type impurity by heat. Next, a first mask forming step is carried out to form a first resist mask that has a first opening for selectively exposing the second conductivity-type well region between the gate electrode and the first resist mask. An ion implantation step is then carried out to ion-implant two types of first conductivity-type impurities having mutually different diffusion coefficients, into the second conductivity-type well region through the first opening by using the gate electrode and the first resist mask as masks. Thereafter, a fourth forming step is carried out to form a first conductivity-type source region and a second conductivity-type low-impurity-concentration region by diffusing the two types of first conductivity-type impurities having mutually different diffusion coefficients by means of annealing.

In the method for manufacturing a semiconductor device of the present invention, according to the invention described above, the ion implantation step may carry out the following steps sequentially. First, a first ion implantation step is carried out to ion-implant the first conductivity-type impurity having a larger diffusion coefficient, out of the two types of first conductivity impurities having mutually different diffusion coefficients, into the second conductivity-type well region through the first opening, with the insulator and the first resist mask serving as masks. Subsequently, a second mask forming step is carried to form, after removing the first resist mask, a second resist mask that has a second opening for selectively exposing the second conductivity-type well region between the insulator and the second resist mask, the second opening having an opening width narrower than that of the first opening. Thereafter, a second ion implantation step is carried out to ion-implant the first conductivity-type impurity having a smaller diffusion coefficient, out of the two types of first conductivity impurities having mutually different diffusion coefficients, into the second conductivity-type well region through the second opening, with the insulator and the second resist mask serving as masks.

In the method for manufacturing a semiconductor device of the present invention, according to the invention described above, the ion implantation step may carry out the following steps sequentially. In other words, a first ion implantation step is carried out to ion-implant the first conductivity-type impurity having a larger diffusion coefficient, out of the two types of first conductivity impurities having mutually different diffusion coefficients, into the second conductivity-type well region through the first opening, with the gate electrode and the first resist mask serving as masks. Next, a second mask forming step is carried out to form, after removing the first resist mask, a second resist mask that has a second opening for selectively exposing the second conductivity-type well region between the gate electrode and the second resist mask, the second opening having an opening width narrower than that of the first opening. Subsequently, a second ion implantation step is carried out to ion-implant the first conductivity-type impurity having a smaller diffusion coefficient, out of the two types of first conductivity impurities having mutually different diffusion coefficients, into the second conductivity-type well region through the second opening, with the gate electrode and the second resist mask serving as masks.

In the method for manufacturing a semiconductor device of the present invention, according to the invention described above, the first conductivity-type impurity having a larger diffusion coefficient, out of the two types of first conductivity impurities having mutually different diffusion coefficients, may be phosphorus. Furthermore, in the method for manufacturing a semiconductor device of the present invention, according to the invention described above, the implantation dosage of ions of the first conductivity-type impurity having a larger diffusion coefficient may be less than the implantation dosage of ions of the second conductivity-type impurity.

According to the invention described above, n-type ionic species having a larger diffusion coefficient than ion species used for forming the $n^+$-type source region are implanted into the opening that is formed between the insulator or the gate electrode and the resist mask such that the surface of the p-type well region is exposed, and then the p-type well region and the n-type source region are subjected to annealing simultaneously to diffuse heat therein. A MOS semiconductor device with a thick gate insulator can be obtained by reducing the impurity concentration in the vicinity of the surface of the joint between p-type well region and the $n^+$-type source region without increasing the gate threshold voltage. Alternatively, the gate threshold voltage is reduced while keeping the film thickness of the gate insulator constant. As a result, the effects of the present invention can be achieved.

In the semiconductor device and the method for manufacturing the same according to the present invention, a semiconductor device with a thick gate insulator can be produced without increasing a gate threshold voltage. Because the intensity of an electric field applied to the gate insulator decreases when the gate insulator is made thick, the reliability of the gate insulator can be improved, thereby enhancing the gate breakdown withstand capability. In addition, providing a thick gate insulator to the semiconductor device can reduce the gate capacity and hence switching losses.

DETAILED DESCRIPTION

Figure 1:
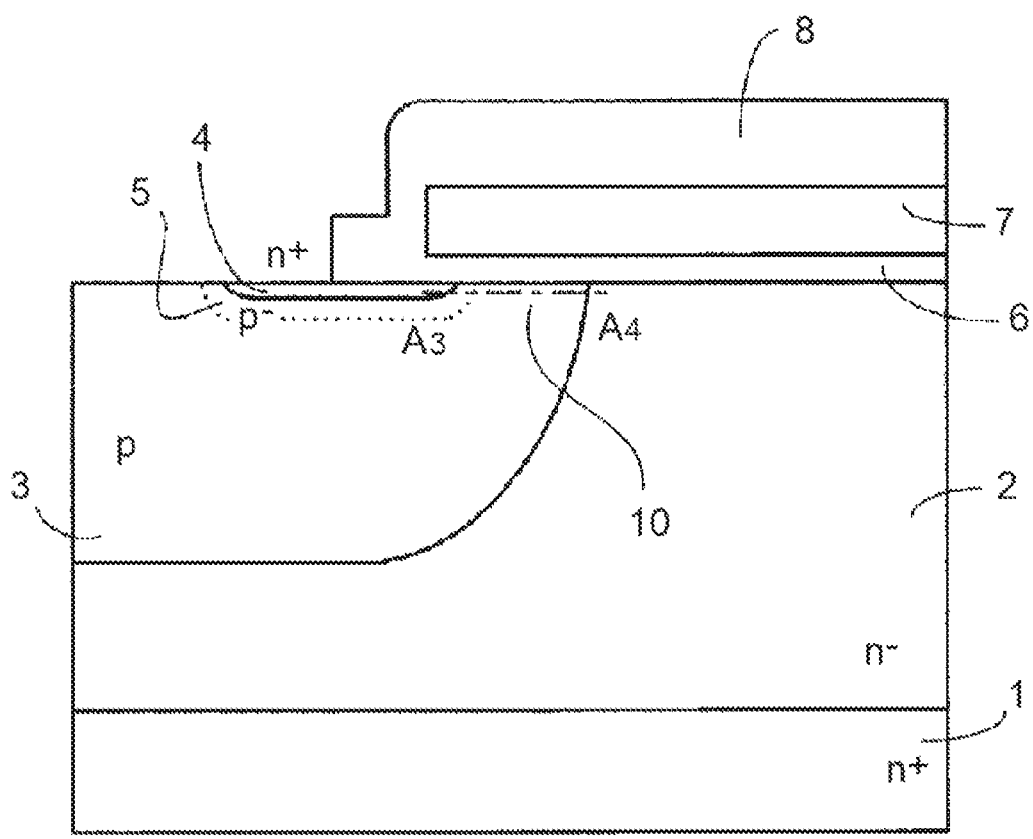
FIG. 1 is a cross-sectional diagram showing substantial parts of a surface MOS structure of a MOSFET according to Embodiment 1 of the present invention.

Favorable embodiments of a semiconductor device and a method for manufacturing the same according to the present invention are described hereinafter in detail with reference to the accompanying drawings. In the present specification and the accompanying drawings, the parts denoted by reference numerals "n" and "p" represent layers and regions in which electrons and holes are the majority carriers. Symbols "+" and "−" accompanying these reference numerals "n" and "p" mean that the layers and regions with these symbols have relatively higher or lower impurity concentrations than those without the symbols. In the following embodiments and the accompanying drawings, the same reference numerals are used for indicating the same components, and therefore the overlapping explanations are omitted accordingly. In addition, for the purpose of illustration and promotion of understanding of the embodiments, the accompanying drawings introduced in the embodiments are not drawn to a precise scale/magnification. Moreover, the present invention should not be construed as being limited to the embodiments unless the present invention departs from the spirit thereof.

Embodiment 1

A semiconductor device according to Embodiment 1 of the present invention is now described with a power MOSFET, one of the MOS-type semiconductor devices, as an example. FIG. 1 is a cross-sectional diagram showing substantial parts of a surface MOS structure of the MOSFET according to Embodiment 1 of the present invention. A surface layer of the front surface of a semiconductor substrate corresponding to an $n^-$ layer 2 is selectively provided with a p-type well region 3. Inside the p-type well region 3 are an $n^+$-type source region 4 and a $p^-$ region 5 selectively. The $n^+$-type source region 4 is exposed on the front surface of the substrate. The $p^-$ region 5 is provided between the $n^+$-type source region 4 and the p-type well region 3 and surrounds the $n^+$-type source region 4. Further, a $p^+$ contact region (not shown) is provided on the inside of the p-type well region 3 so as to be in contact with the $p^-$ region 5.

A front surface of a channel forming region 10 sandwiched between the $n^+$-type source region 4 and the $n^-$ layer 2 in the p-type well region 3 is provided with a gate electrode 7 made of polysilicon, with a gate insulator 6 between the channel forming region 10 and the gate electrode 7. A source electrode (not shown) is in contact with the p-type well region 3, the $n^+$-type source region 4, and the $p^-$ region 5 and electrically insulated from the gate electrode 7 by an interlayer insulator 8. A surface layer of the rear surface of the semiconductor substrate is provided with an $n^+$ layer 1. A drain electrode (not shown) is provided on the rear surface of the semiconductor substrate so as to be in contact with the $n^+$ layer 1.

Figure 2:
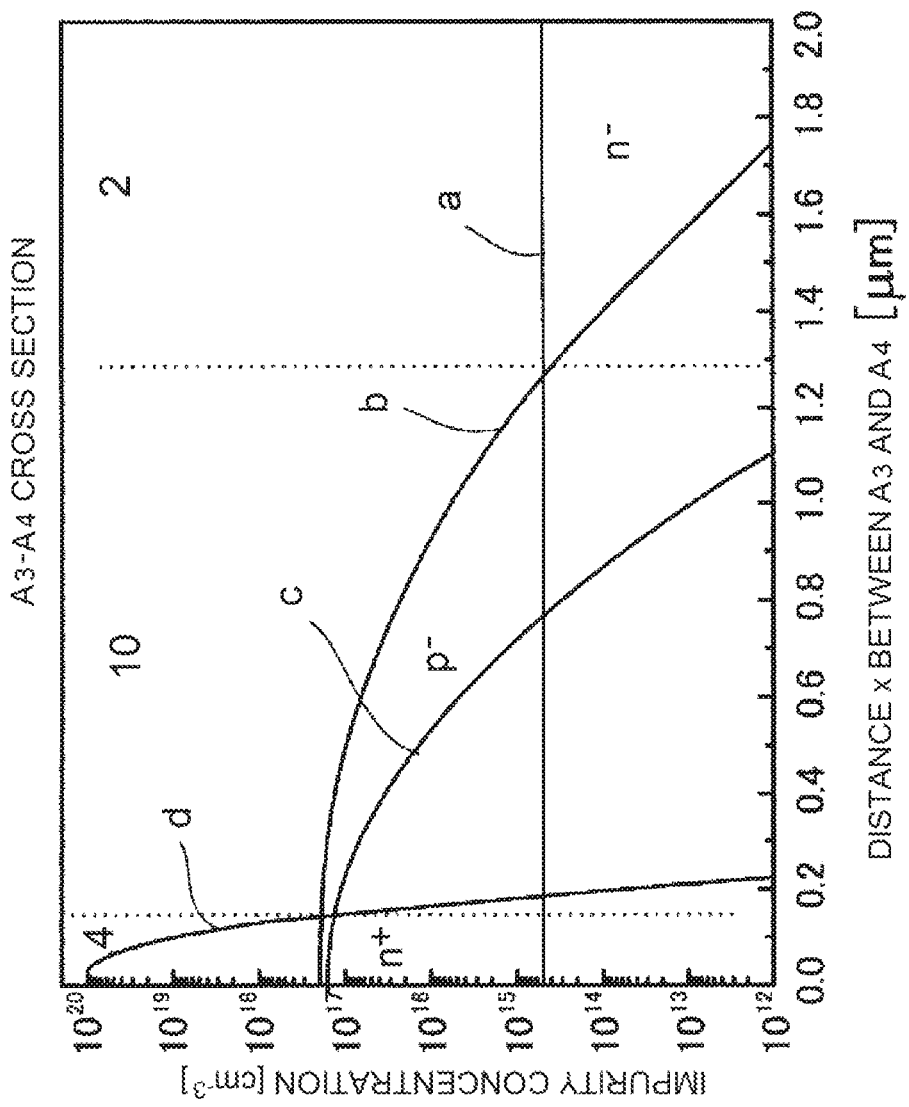
FIG. 2 is a characteristic diagram showing a distribution of impurity concentrations in the regions along line $A_3$-$A_4$ of FIG. 1, the distribution being obtained when concentration compensation is not performed at a region boundary.

Next are described distributions of concentrations of impurities in the vicinity of the channel forming region 10 of the semiconductor device according to Embodiment 1 of the present invention. FIG. 2 is a characteristic diagram showing a distribution of impurity concentrations in the regions along line $A_3$-$A_4$ of FIG. 1, the distribution being obtained when concentration compensation is not performed at a region boundary. FIG. 2 illustrates a concentration distribution of an impurity which is a dopant placed in each of the regions that are adjacent to each other along the line $A_3$-$A_4$ extending horizontally on the main surface, the surface layer of the semiconductor substrate having the surface MOS structure of the MOSFET shown in FIG. 1. The abovementioned regions adjacent to each other along the line $A_3$-$A_4$ are the $n^+$-type source region 4, the channel forming region 10 within the p-type well region 3, and the $n^-$ layer 2 which is the semiconductor substrate, and the curves within these regions indicate the curves that form distributions of concentrations of impurities that are doped for the purpose of forming these regions. A horizontal straight line as shown in FIG. 2 expresses an impurity concentration distribution of the semiconductor substrate ($n^-$ layer 2) having an n-type impurity dispersed substantially evenly therein. A curve b expresses a distribution of a concentration of boron that is doped for the purpose forming the p-type well region 3.

Figure 3:
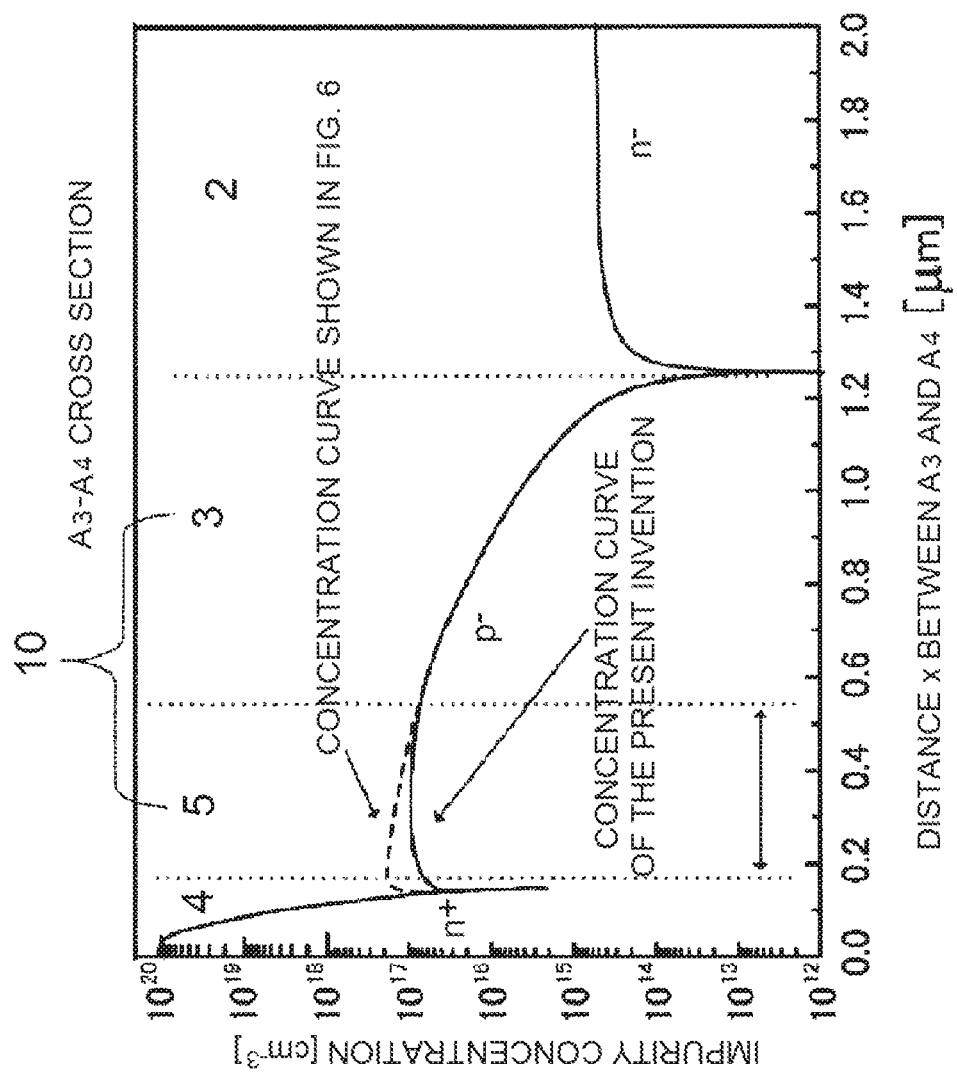
FIG. 3 is a characteristic diagram showing a distribution of impurity concentrations in the regions along line $A_3$-$A_4$ of the MOSFET of the present invention, the distribution being obtained when concentration compensation is performed at a region boundary.
Figure 4:
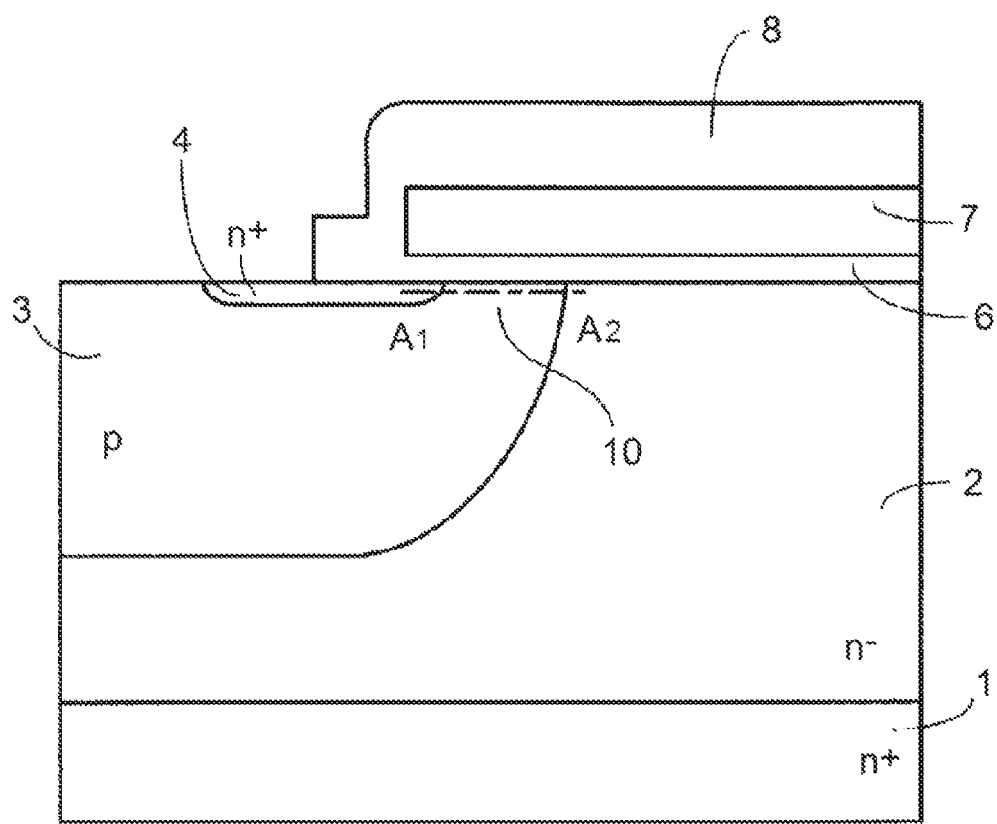
FIG. 4 is a cross-sectional diagram showing substantial parts of a surface MOS structure of a conventional MOSFET.
Figure 5:
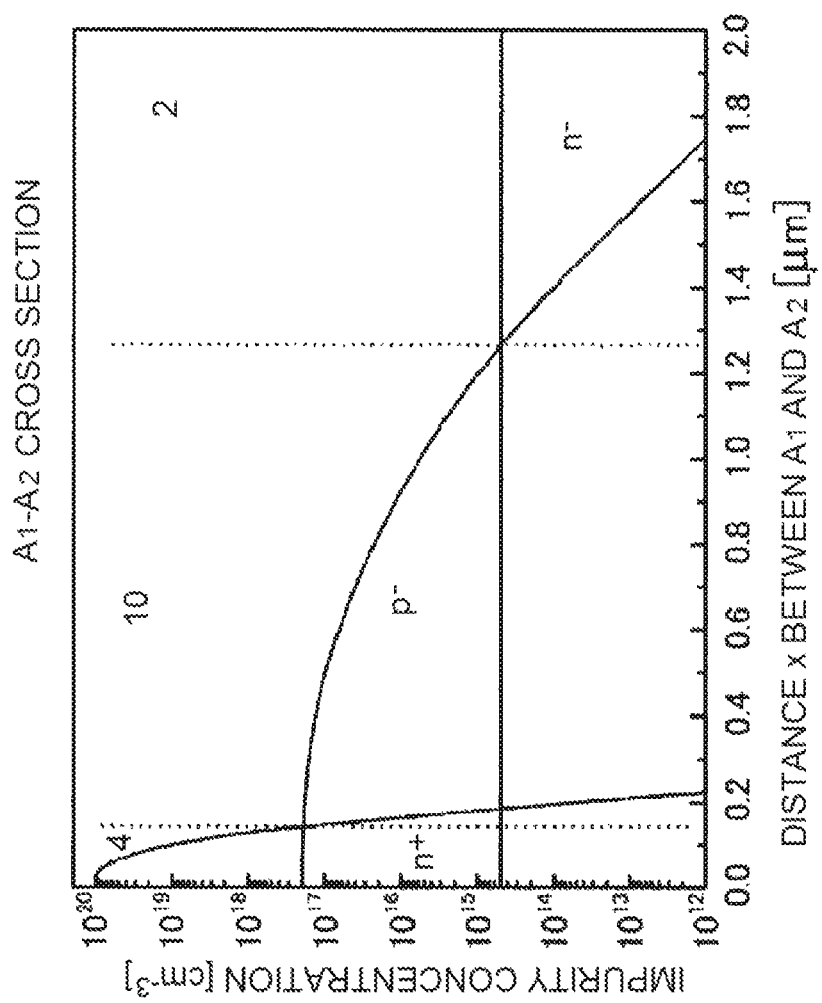
FIG. 5 is a characteristic diagram showing a distribution of impurity concentrations in the regions disposed along line $A_1$-$A_2$ of FIG. 4, the distribution being obtained when concentration compensation is not performed at a region boundary.

A curve c expresses a distribution of a concentration of phosphorus (P) that is doped for the purpose of forming the $p^-$ region 5 in the channel forming region 10 which is a feature of the present invention. A curve d expresses a distribution of a concentration of arsenic that is doped for the purpose of forming the $n^+$-type source region 4. FIG. 3 shows distributions of net doping concentrations that take account of concentration compensation between the dopants of mutually different conductivity types (donor and acceptor) which are obtained at regions where the abovementioned dopants are mixed. FIG. 3 is a characteristic diagram showing a distribution of impurity concentrations in the regions along line $A_3$-$A_4$ of the MOSFET of the present invention, the distribution being obtained when concentration compensation is performed at a region boundary. While a concentration curve shown by a dashed line in FIG. 3 is a part of the abovementioned conventional concentration distribution shown in FIG. 6, a curve shown by a solid line indicates the concentration in the $p^-$ region 5 according to the present invention. The concentration of phosphorus shown by the curve c in FIG. 2 compensates the concentration of boron shown by the curve b. Therefore, as shown in FIG. 3, the impurity concentration shown by the curve of the net doping concentration distribution within the range of 0.2 μm to 0.5 μm from the front surface of the substrate (i.e., the interface between the semiconductor substrate and the gate insulator 6: distance x=0) starts to partially drop in the channel forming region 10.

Next, for the purpose of describing a method for manufacturing the MOSFET according to Embodiment 1 of the present invention, a method for manufacturing a vertical n-channel MOSFET is illustrated as an example. FIGS. 7 to 14 are cross-sectional diagrams of substantial parts of the semiconductor substrate, each showing sequentially the steps of manufacturing the surface MOS structure of the MOSFET according to Embodiment 1 of the present invention. First, a thick field oxide film 11 is made grow on the front surface of a silicon substrate (a surface on the $n^-$ layer 2 side) formed by stacking the $n^+$ layer 1 and the $n^-$ layer 2. Next, the field oxide film 11 is patterned by means of photolithography or etching, to form an oxide mask having an open pattern for forming a well. Subsequently, a screen oxide film 12 thinner than the field oxide film 11 is formed on an opening 11a of the oxide mask formed by patterning the field oxide film 11.

Figure 8:
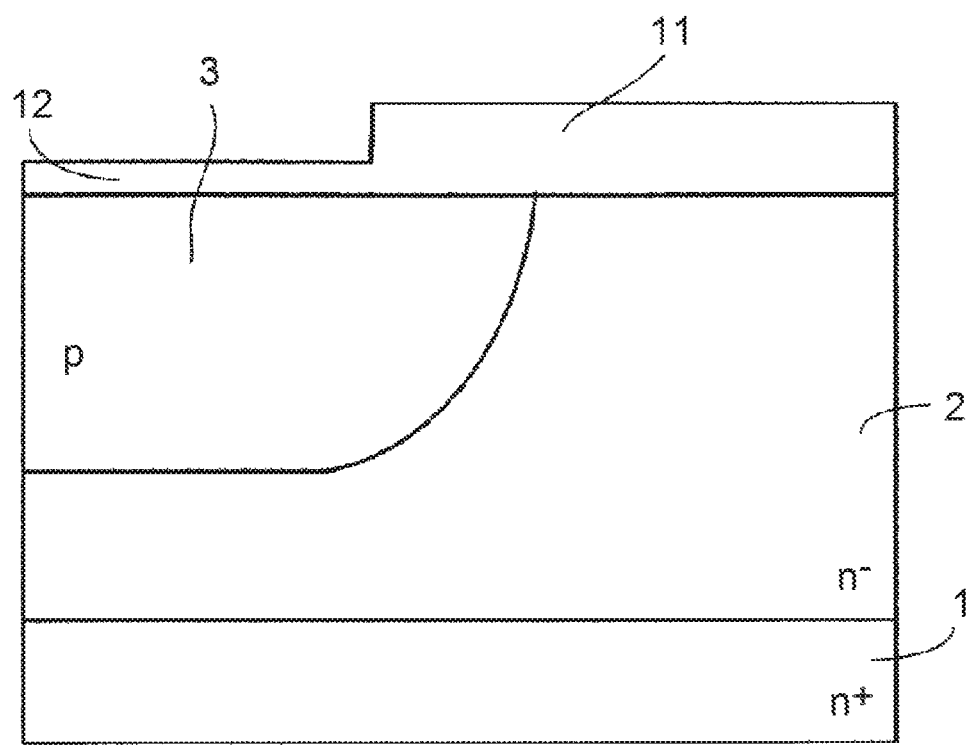
FIG. 8 is a cross-sectional diagram of substantial parts of the semiconductor substrate, showing sequentially the steps of manufacturing the surface MOS structure of the MOSFET according to Embodiment 1 of the present invention (2)
Figure 9:
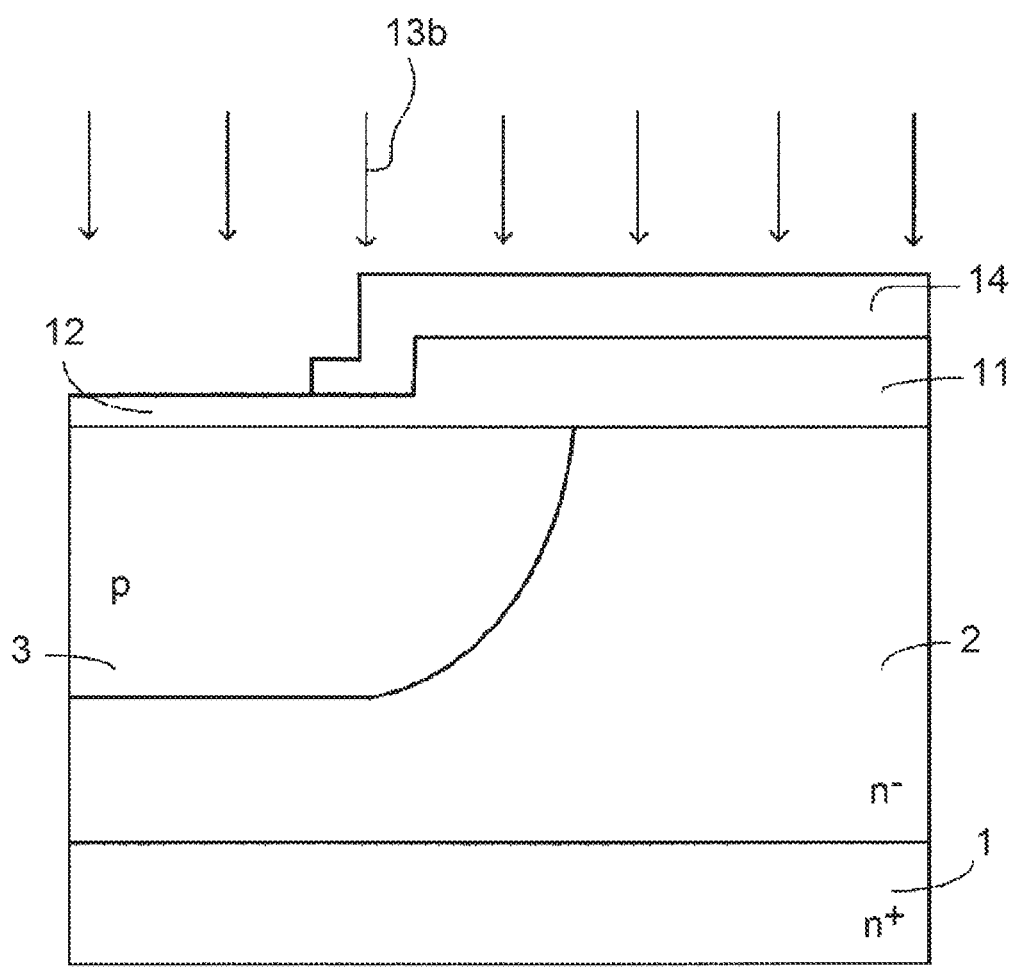
FIG. 9 is a cross-sectional diagram of substantial parts of the semiconductor substrate, showing sequentially the steps of manufacturing the surface MOS structure of the MOSFET according to Embodiment 1 of the present invention (3)
Figure 10:
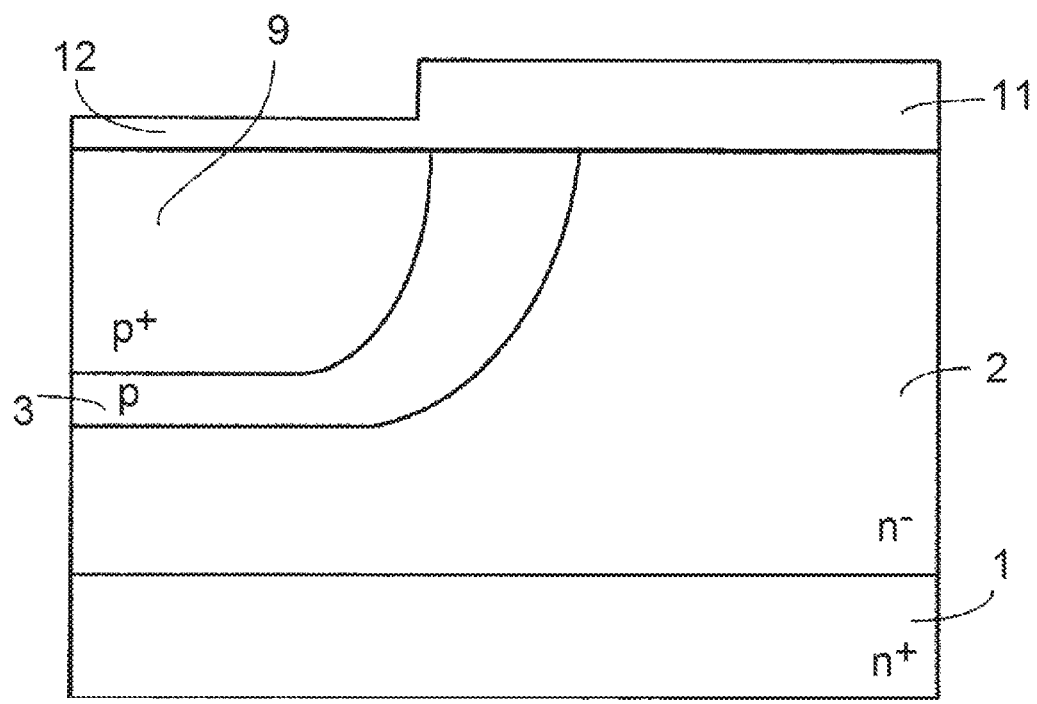
FIG. 10 is a cross-sectional diagram of substantial parts of the semiconductor substrate, showing sequentially the steps of manufacturing the surface MOS structure of the MOSFET according to Embodiment 1 of the present invention (4)

Next, masking with the oxide mask of the field oxide film 11, boron ion ($B^+$) implantation 13a is carried out at certain energy to implant boron (B) ions through the thin screen oxide film 12 (FIG. 7), and then heat is dispersed so as to form the p-type well region 3 of a predetermined depth (FIG. 8). Subsequently, a resist mask 14 is formed on the front surface of the silicon substrate by means of photolithography, the resist mask 14 having an open area for forming a $p^+$ contact region 9. Masking with this resist mask 14, boron ion implantation 13b is carried out at appropriate energy to implant boron ions through the screen oxide film 12 (FIG. 9). The resist mask 14 is then peeled off, and the implanted boron ions are annealed, to form the $p^+$ contact region 9 (FIG. 10).

Figure 11:
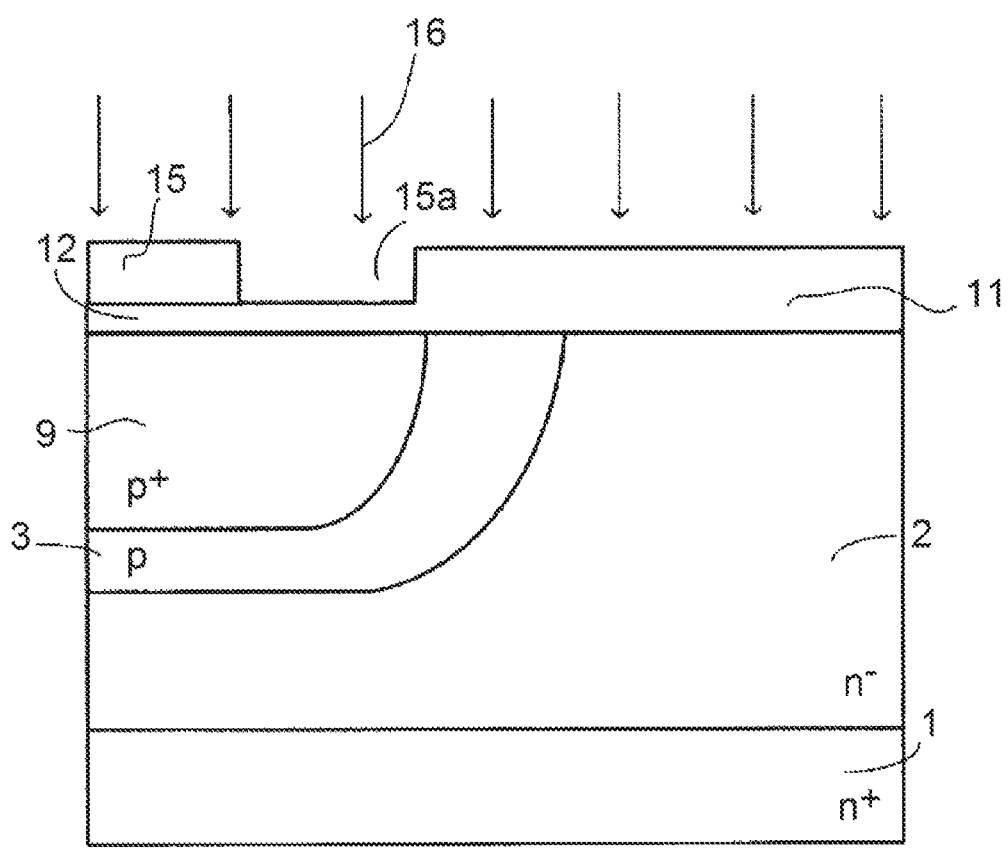
FIG. 11 is a cross-sectional diagram of substantial parts of the semiconductor substrate, showing sequentially the steps of manufacturing the surface MOS structure of the MOSFET according to Embodiment 1 of the present invention (5)
Figure 12:
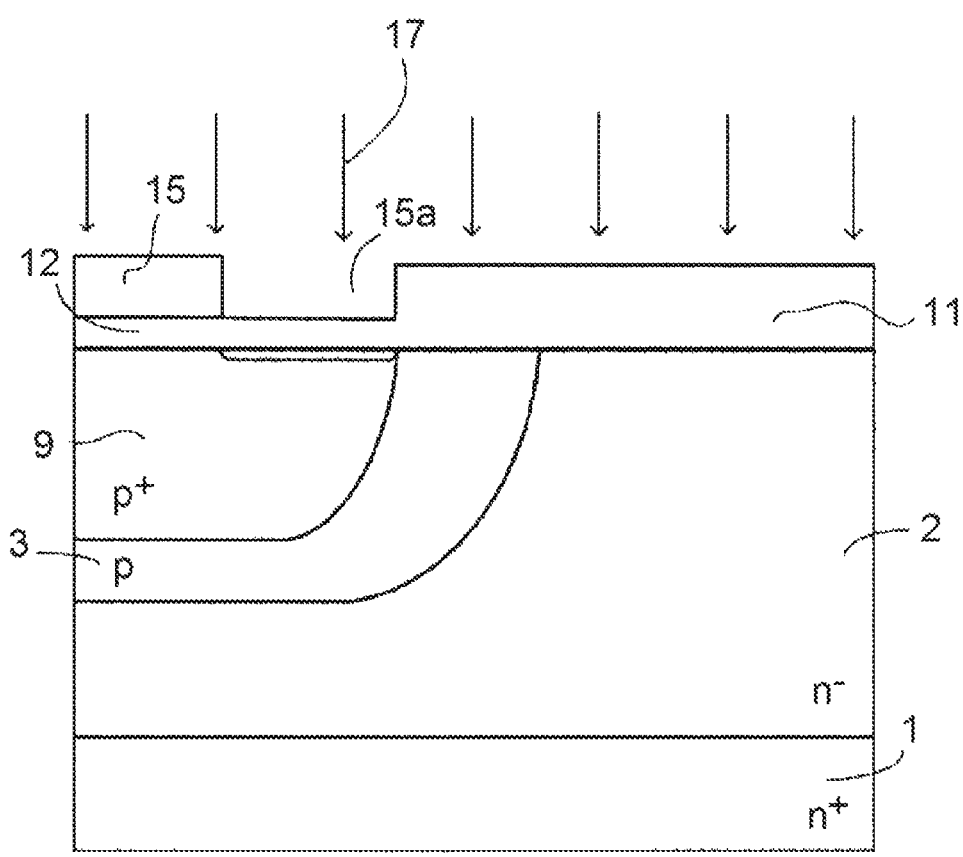
FIG. 12 is a cross-sectional diagram of substantial parts of the semiconductor substrate, showing sequentially the steps of manufacturing the surface MOS structure of the MOSFET according to Embodiment 1 of the present invention (6)

With the use of photolithography again, a resist mask 15 is formed in such a manner that the area for forming the $n^+$-type source region 4 is exposed on the front surface of the silicon substrate. Arsenic ion ($As^+$) implantation 16 is carried out at appropriate energy to implant arsenic ions through the screen oxide film 12 that is exposed on an opening 15a between the resist mask 15 and the oxide mask of the field oxide film 11 (FIG. 11). Next, for example, phosphorus ion implantation 17 is implemented in which an n-type impurity having a diffusion coefficient larger than that of arsenic is implanted at an appropriate energy through the screen oxide film 12 that is exposed on the opening 15a between the resist mask 15 and the oxide mask of the field oxide film 11, in the same manner that arsenic ion implantation 16 is performed (FIG. 12). It should be noted that arsenic ion implantation 16 and phosphorus implantation 17 can be executed interchangeably; therefore, the arsenic ion implantation 16 may be carried out subsequent to phosphorus ion implantation 17.

Figure 13:
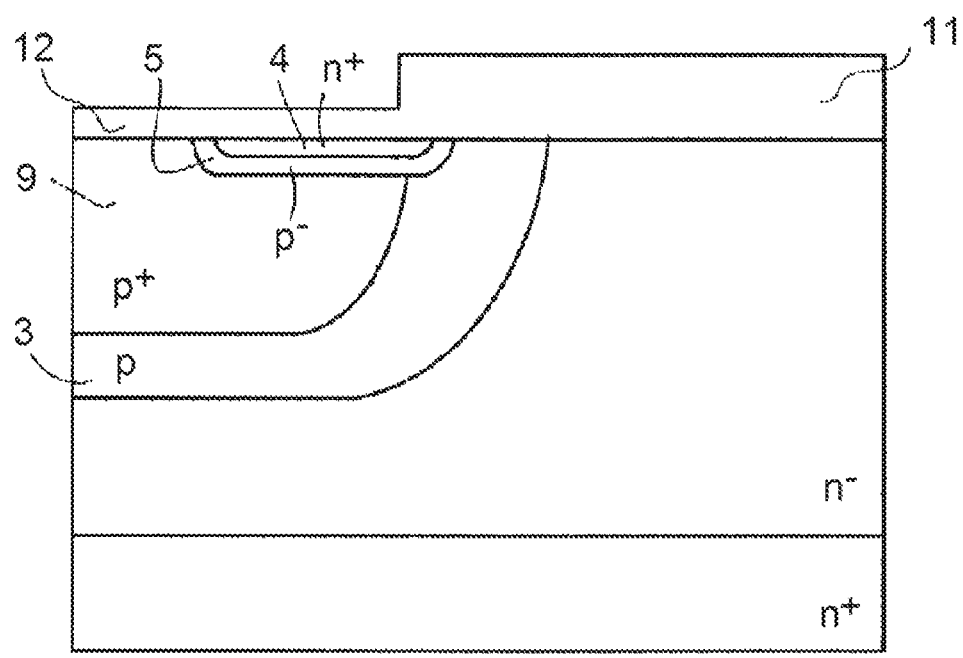
FIG. 13 is a cross-sectional diagram of substantial parts of the semiconductor substrate, showing sequentially the steps of manufacturing the surface MOS structure of the MOSFET according to Embodiment 1 of the present invention (7)

The resist mask 15 is then peeled off, and the implanted arsenic ions and phosphorus ions are simultaneously annealed (thermally treated). As a result, the $n^+$-type source region 4 is formed, as well as the $p^-$ region 5 around the region surrounding the $n^+$-type source region 4, the $p^-$ region 5 having the concentration of the impurity compensated by the doped phosphorus (FIG. 13). The $p^-$ region 5 is compensated in such a manner that the concentrations of p-type impurities in the p-type well region 3 and the $p^+$ contact region 9 are reduced by the doped phosphorus. The oxide mask of the field oxide film 11 enables self-alignment formation of the p-type well region 3, the $n^+$-type source region 4, and the $p^-$ region 5 in the area where a channel is formed.

When performing phosphorus ion implantation 17, the dosage of the phosphorus ions is set as follows. In other words, the phosphorus dosage is set in such a manner that the annealing process causes the concentration of the phosphorus implanted in phosphorus ion implantation 17 to compensate the doping concentration in a part of the p-type well region 3 with which the $n^+$-type source region 4 is in contact, and that the polarity of phosphorus is not reversed to n-type. In order to do so, it is important to at least make the amount of the phosphorus ions to be doped during phosphorus ion implantation 17 be lower than the dosage of p-type impurity ions (e.g., the boron ions implanted during boron ion implantation 13a) to be implanted to form the p-type well region 3.

Figure 14:
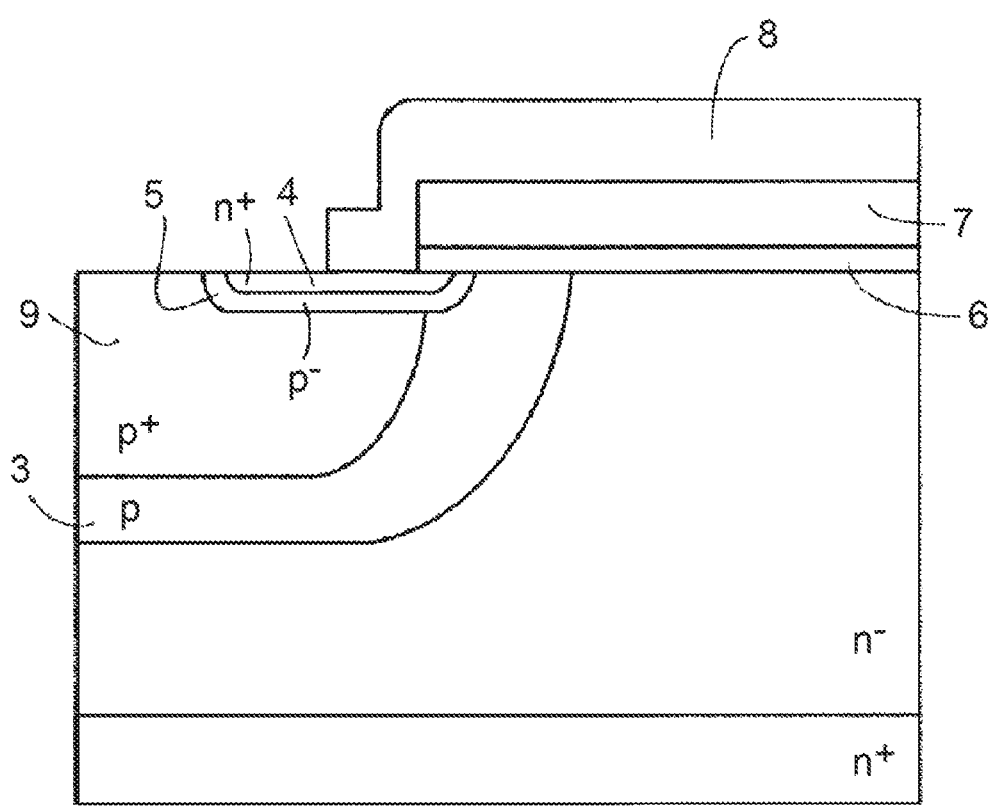
FIG. 14 is a cross-sectional diagram of substantial parts of the semiconductor substrate, showing sequentially the steps of manufacturing the surface MOS structure of the MOSFET according to Embodiment 1 of the present invention (8)
Figure 15:
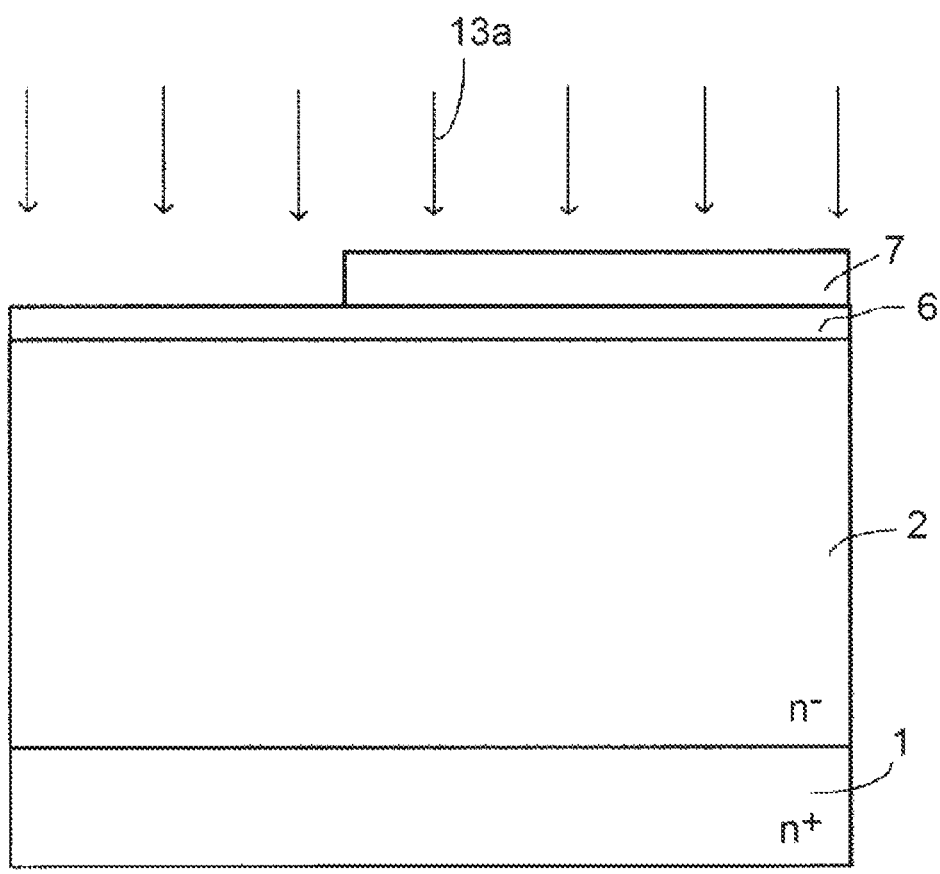
FIG. 15 is a cross-sectional diagram of substantial parts of a semiconductor substrate, showing sequentially the steps of manufacturing a surface MOS structure of a MOSFET according to Embodiment 2 of the present invention (1)

Next, the screen oxide film 12 and the rest of the field oxide film 11 are removed by etching and exposed on the front surface of the silicon substrate. Subsequently, the gate insulator 6 is formed on the front surface of the silicon substrate. Thereafter, a polysilicon layer is formed on the gate insulator 6 and then patterned by means of photolithography and etching, to form the gate electrode 7. Subsequently, an insulator is formed and patterned by means of photolithography and etching, to form the interlayer insulator 8. As a result, a cell structure of the MOSFET including the surface MOS structure is formed. A vertical n-channel MOSFET is completed by forming, for example, a source electrode and a drain electrode (not shown) in the resultant cell structure by using a general method (FIG. 14).

Figure 6:
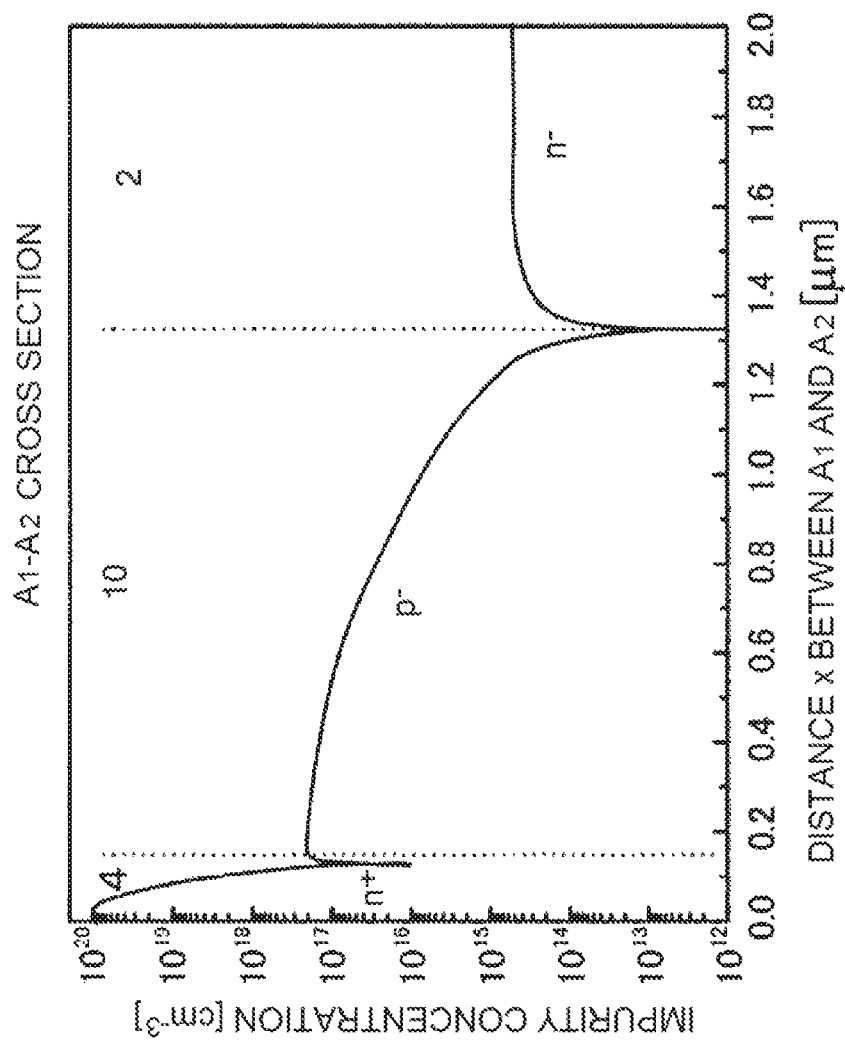
FIG. 6 is a characteristic diagram showing a distribution of impurity concentrations in the regions disposed along line $A_1$-$A_2$ of FIG. 4, the distribution being obtained when concentration compensation is performed at a region boundary.
Figure 7:
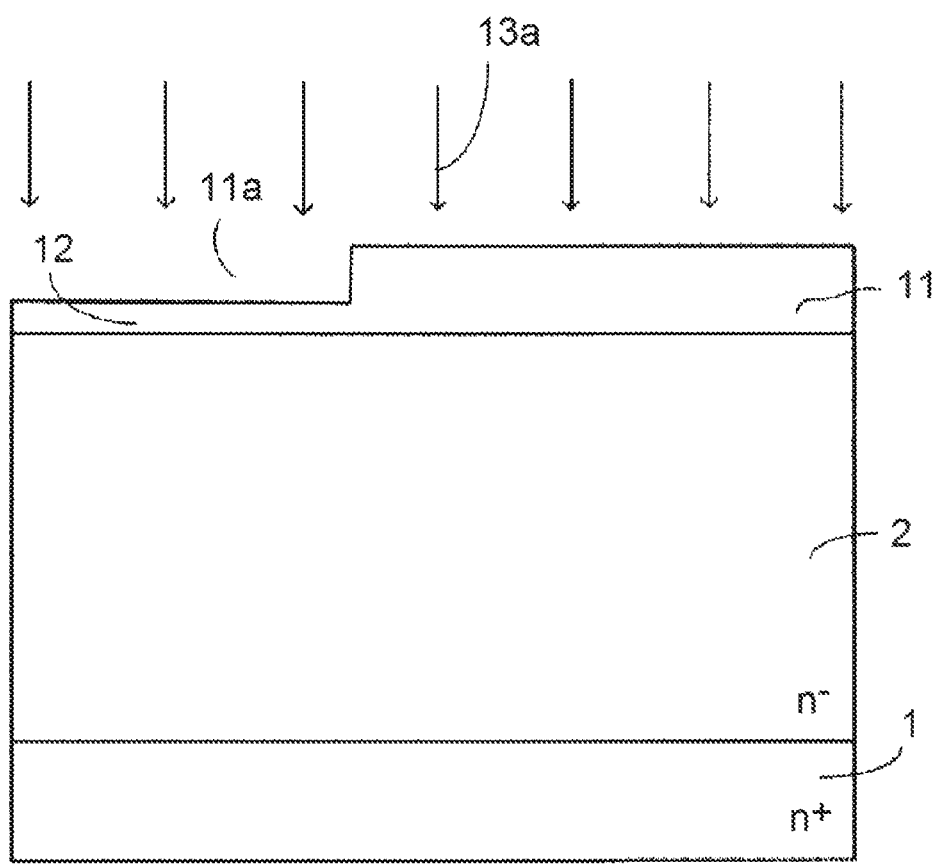
FIG. 7 is a cross-sectional diagram of substantial parts of a semiconductor substrate, showing sequentially the steps of manufacturing the surface MOS structure of the MOSFET according to Embodiment 1 of the present invention (1)

As shown in FIG. 3, it is understood, according to this manufacturing method, that especially the net doping concentration distribution of the channel forming region 10 of the surface MOS structure of the MOSFET according to Embodiment 1 decreases from the pattern shown by the dashed line (the doping distribution shown in FIG. 6) to the pattern shown by the solid line, compared to the conventional concentration distribution of the same area shown in FIG. 6. The reasons why the impurity concentration in the channel forming region 10 decreases are as follows. The first reason is that, when forming the p⁻ region 5 and the n⁺-type source region 4, after implanting arsenic ions and phosphorus ions having a diffusion coefficient larger than that of arsenic through the opening of the same ion implantation mask to form the p⁻ region 5 and the n⁺-type source region 4, these impurities are annealed simultaneously. The second reason is that the dosage of phosphorus in phosphorus ion implantation 17 for forming the p⁻ region 5 is made less than the dosage of boron in boron ion implantation 13a for forming the p-type well region 3. In the conventional MOSFET shown in FIG. 6, only arsenic ions are implanted in order to form the n⁺-type source region 4.

Also, in the present invention, the solid line of FIG. 3 (the present invention) indicating particularly the impurity concentration in the vicinity of the joint between the n⁺-type source region 4 and the p⁻ region 5 shows that the impurity concentration in the front surface of the channel forming region 10 is lower than that of the conventional structure shown by the dashed line. In other words, because the p⁻ region 5 is formed on the inside of the p-type well region 3 by compensation of the concentration of boron in the p-type well region 3 by the concentration of phosphorus, the net doping concentration in the vicinity of the joint between the p-type well region 3 and the n⁺-type source region 4 becomes lower than the concentration of boron in a section of the p-type well region 3 that is distant from the n⁺-type source region 4.

A gate threshold voltage applied to the MOSFET of Embodiment 1 of the present invention produced as described above can be set as follows. The gate threshold voltage doubles when the film thickness of the gate insulator 6 doubles. Therefore, when a gate threshold voltage obtained by doubling the film thickness of the gate insulator 6 is taken as an original gate threshold voltage (which is obtained when the film thickness of the gate insulator 6 is one time (×1)), the net doping concentration in the vicinity of the joint between the p-type well region 3 and the n⁺-type source region 4 may be set to be approximately ¼ to ½ of the boron concentration in the section of the p-type well region 3 that is distant from the n⁺-type source region 4. Concretely speaking, the phosphorus ion dosage in phosphorus ion implantation 17 for forming the p⁻ region 5 may be set to be approximately ¼ to ½ of the boron ion dosage in boron ion implantation 13a for forming the p-type well region 3.

The trade-off relationship between the gate threshold voltage and gate breakdown withstand capability can be improved more by the surface MOS structure of the MOSFET according to Embodiment 1 of the present invention that has the net doping concentration shown in FIG. 3, than by the surface MOS structure having the conventional concentration distribution shown in FIG. 6. In other words, when keeping the gate threshold voltage at substantially the same level as that obtained in the conventional structure, the gate breakdown withstand capability can be improved by making the film thickness of the gate insulator 6 thicker than that in the conventional structure. Conversely, when keeping the film thickness of the gate insulator 6 at substantially the same level as that of the conventional structure, the gate threshold voltage can be made lower than that of the conventional structure. The gate breakdown withstand capability can be improved by setting the impurity concentration of the p⁻ region 5 and the film thickness of the gate insulator 6 at appropriate values and reducing the gate threshold voltage.

According to Embodiment 1 described above, with the same ion implantation mask, the n⁺-type source region is formed on the inside of the p-type well region and then the p⁻ region around the n⁺-type source region. In this manner, the n⁺-type source region and the p⁻ region can accurately be formed by self-alignment. In addition, the net doping concentration of the p-type well region in the vicinity of the joint between the p-type well region and the n⁺-type source region (in the vicinity of the channel forming region) can be made lower than the impurity concentration in the same region. Therefore, the gate insulator can be made thicker without increasing the gate threshold voltage. As a result, the intensity of an electric field applied to the gate insulator is reduced, improving the reliability of the gate insulator and enhancing the gate breakdown withstand capability. Providing the thick gate insulator in the structure leads to a reduction in a gate capacitance and hence switching losses. Furthermore, because the impurity concentration in the channel forming region is adjusted by providing the p⁻ region in the p-type well region, the gate threshold voltage can be adjusted to a low voltage while preventing the depletion layer from being the punch-through state.

Embodiment 2

Next is described a method for manufacturing a semiconductor device according to Embodiment 2 of the present invention, with reference to an example of manufacturing an n-channel MOSFET. FIGS. 15 to 22 are cross-sectional diagrams of substantial parts of a semiconductor substrate, each showing sequentially the steps of manufacturing a surface MOS structure of the MOSFET according to Embodiment 2 of the present invention. The difference between the method for manufacturing a semiconductor device according to Embodiment 2 and the method for manufacturing a semiconductor device according to Embodiment 1 is that the gate insulator 6 and the gate electrode 7 made of polysilicon are formed prior to forming the p-type well region 3 and the n⁺-type source region 4. In other words, masking with the gate electrode 7, the p-type well region 3, the n⁺-type source region 4, and the p⁻ region 5 are formed by self-alignment in Embodiment 2, the p-type well region 3 being disposed where a channel is formed.

Figure 16:
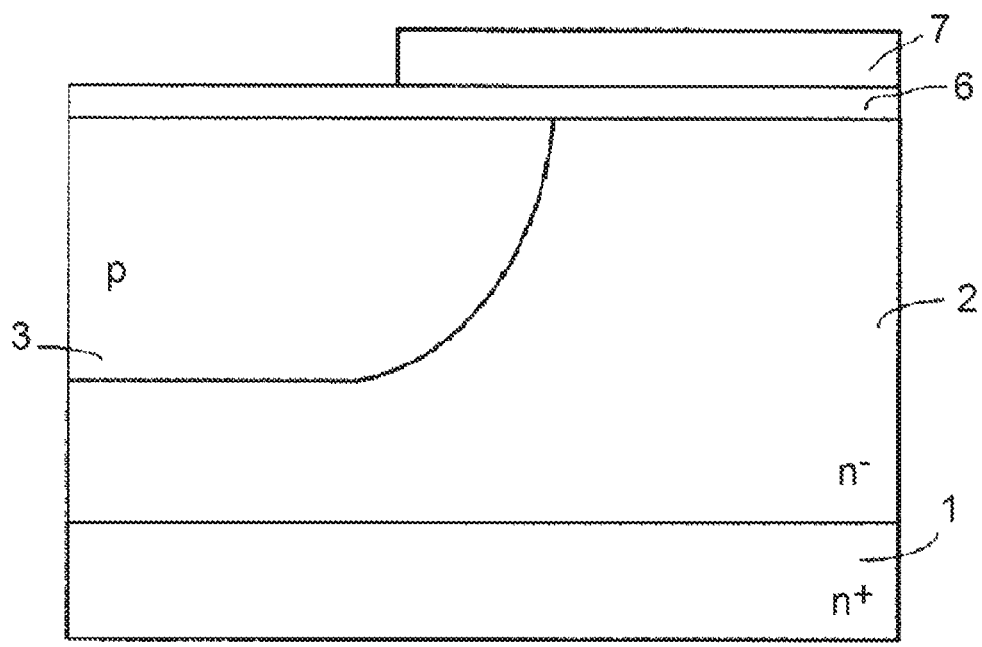
FIG. 16 is a cross-sectional diagram of substantial parts of the semiconductor substrate, showing sequentially the steps of manufacturing the surface MOS structure of the MOSFET according to Embodiment 2 of the present invention (2)
Figure 17:
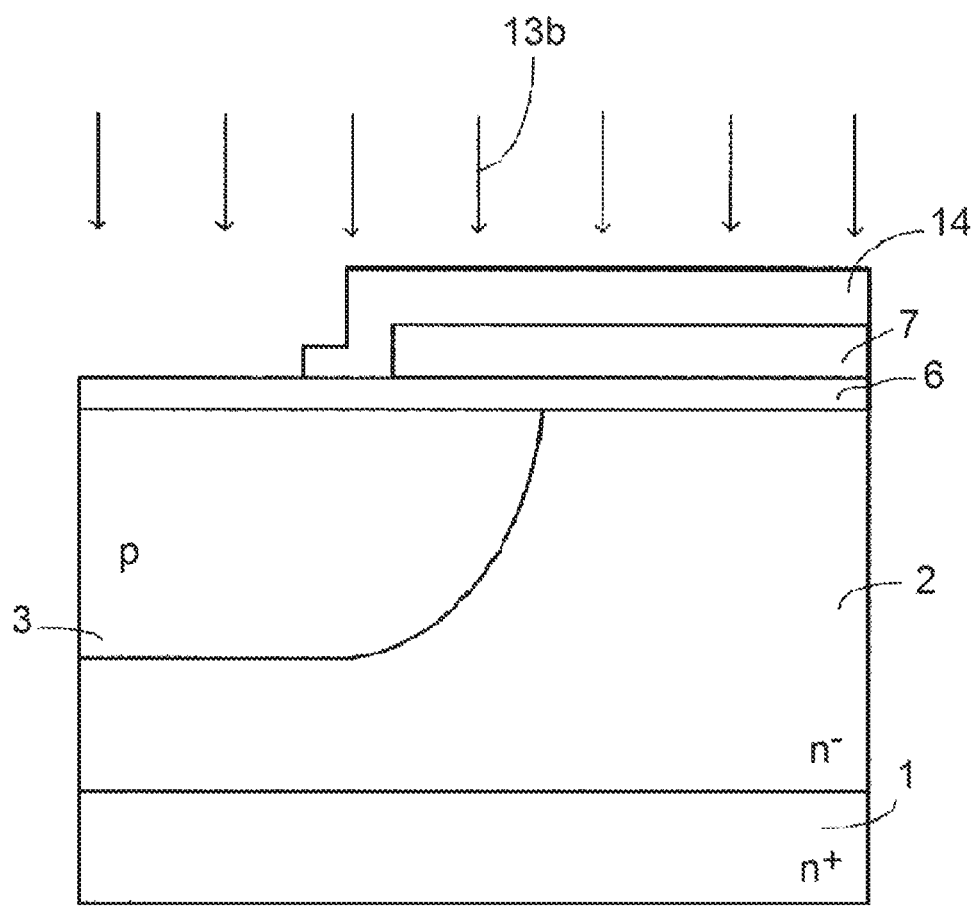
FIG. 17 is a cross-sectional diagram of substantial parts of the semiconductor substrate, showing sequentially the steps of manufacturing the surface MOS structure of the MOSFET according to Embodiment 2 of the present invention (3)
Figure 18:
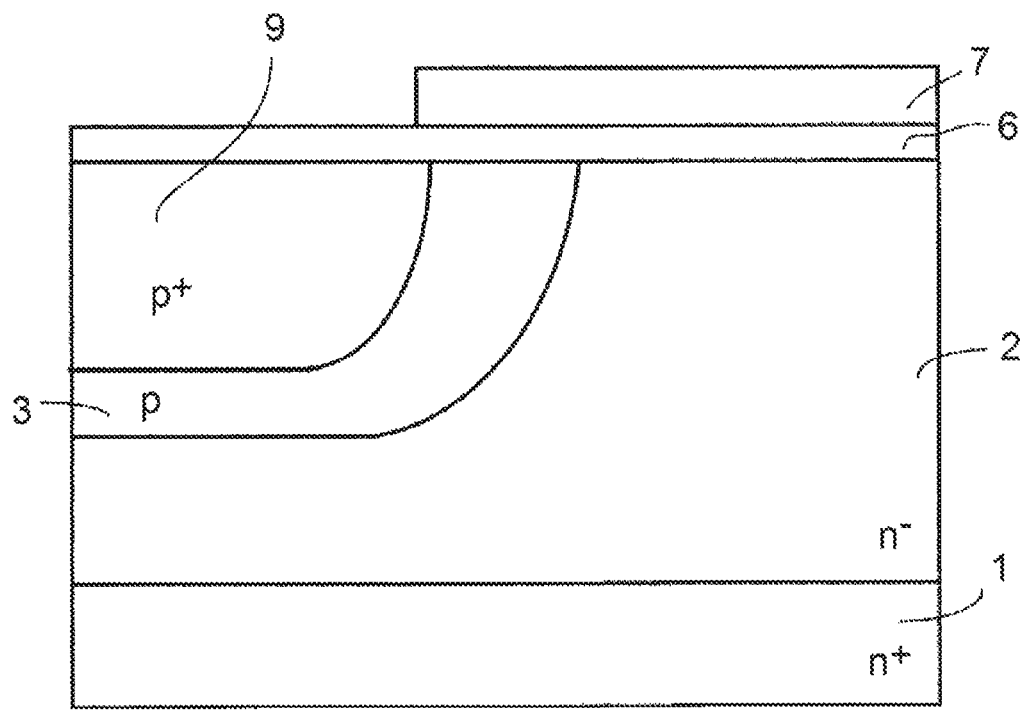
FIG. 18 is a cross-sectional diagram of substantial parts of the semiconductor substrate, showing sequentially the steps of manufacturing the surface MOS structure of the MOSFET according to Embodiment 2 of the present invention (4)

Concretely speaking, first of all, a gate insulator 6 is formed on the front surface of a silicon substrate (a surface on an n⁻ layer 2 side) same as that of Embodiment 1. Then, a polysilicon layer is formed on the gate insulator 6, which is then patterned by means of photolithography and etching, to obtain a gate electrode 7. Subsequently, boron ion implantation 13a is carried out at certain energy to implant boron (B) ions through the thin gate insulator 6 (FIG. 15), and then heat is dispersed therein so as to form a p-type well region 3 of a predetermined depth (FIG. 16). Next, a resist mask 14 is formed on the gate electrode 7 by means of photolithography, the resist mask 14 having an open area for forming a p⁺ contact region 9. Masking with this resist mask 14, boron ion implantation 13b is carried at appropriate energy to implant boron ions through the gate insulator 6 (FIG. 17). The resist mask 14 is then peeled off, and then the implanted boron ions are annealed, thereby forming the p⁺ contact region 9 (FIG. 18).

Figure 19:
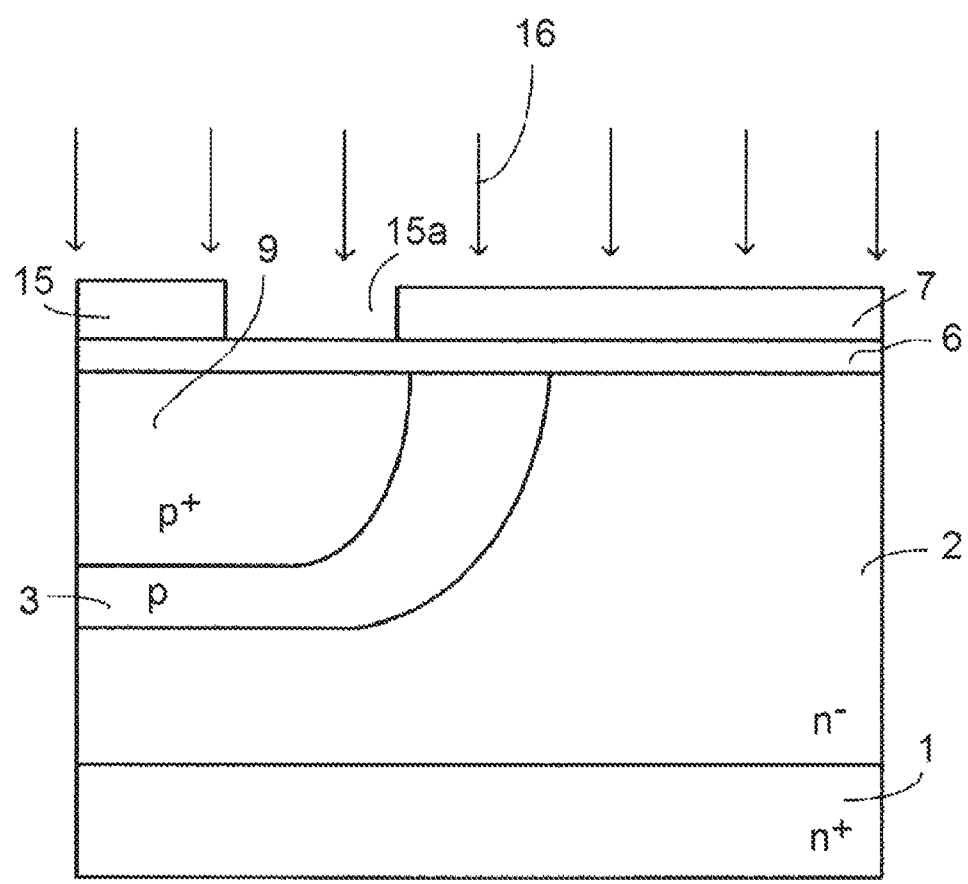
FIG. 19 is a cross-sectional diagram of substantial parts of the semiconductor substrate, showing sequentially the steps of manufacturing the surface MOS structure of the MOSFET according to Embodiment 2 of the present invention (5)
Figure 20:
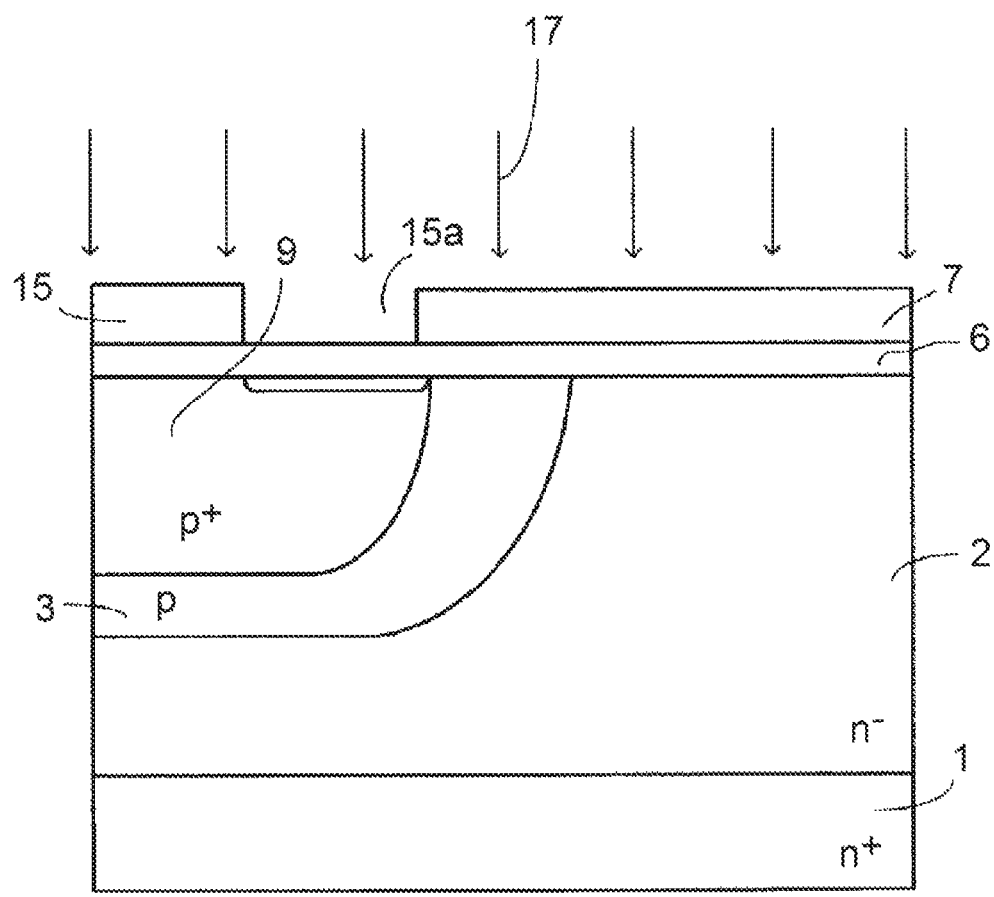
FIG. 20 is a cross-sectional diagram of substantial parts of the semiconductor substrate, showing sequentially the steps of manufacturing the surface MOS structure of the MOSFET according to Embodiment 2 of the present invention (6)

With the use of photolithography again, a resist mask 15 is formed in such a manner that the area for forming the n⁺-type source region 4 is exposed on the front surface of the silicon substrate. Arsenic ion implantation 16 is carried out at appropriate energy to implant arsenic ions through the gate insulator 6 that is exposed on an opening 15a between the resist mask 15 and the gate electrode 7 (FIG. 19). Next, phosphorus ion implantation 17 is carried out to implant an n-type impurity having a diffusion coefficient larger than that of arsenic, such as phosphorus, at an appropriate energy through the gate insulator 6 that is exposed on the opening 15a between the resist mask 15 and the gate electrode 7, in the same manner as arsenic ion implantation 16 (FIG. 20). The resist mask 15 is peeled off thereafter.

Figure 21:
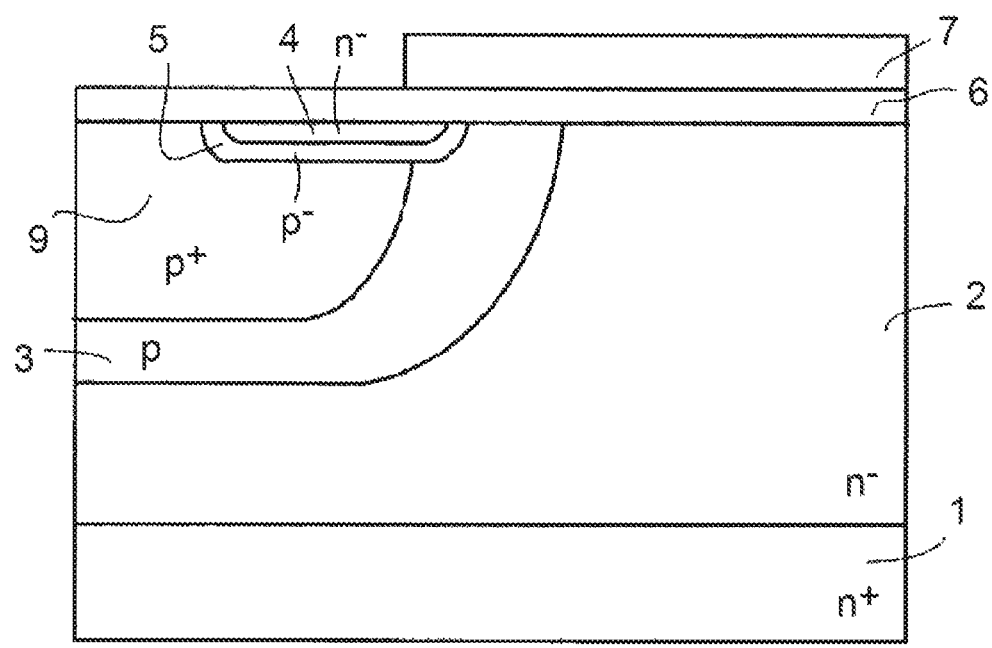
FIG. 21 is a cross-sectional diagram of substantial parts of the semiconductor substrate, showing sequentially the steps of manufacturing the surface MOS structure of the MOSFET according to Embodiment 2 of the present invention (7)

The implanted arsenic ions and phosphorus ions are simultaneously annealed to form the $n^+$-type source region 4 and the $p^-$ region 5 around the $n^+$-type source region 4 (FIG. 21). The dosage of the phosphorus ions implanted in phosphorus ion implantation 17 is the same as the dosage described in Embodiment 1. In other words, the phosphorus ion dosage is set in such a manner that the annealing process causes the concentration of the phosphorus implanted in phosphorus ion implantation 17 to compensate the doping concentration in a part of the p-type well region 3 with which the $n^+$-type source region 4 is in contact, and that the polarity of phosphorus is not reversed to n-type. In order to do so, at least the amount of the phosphorus ions doped in phosphorus ion implantation 17 is made lower than the dosage of p-type impurity ions (e.g., the boron ions implanted in boron ion implantation 13a) to be implanted to form the p-type well region 3.

Figure 22:
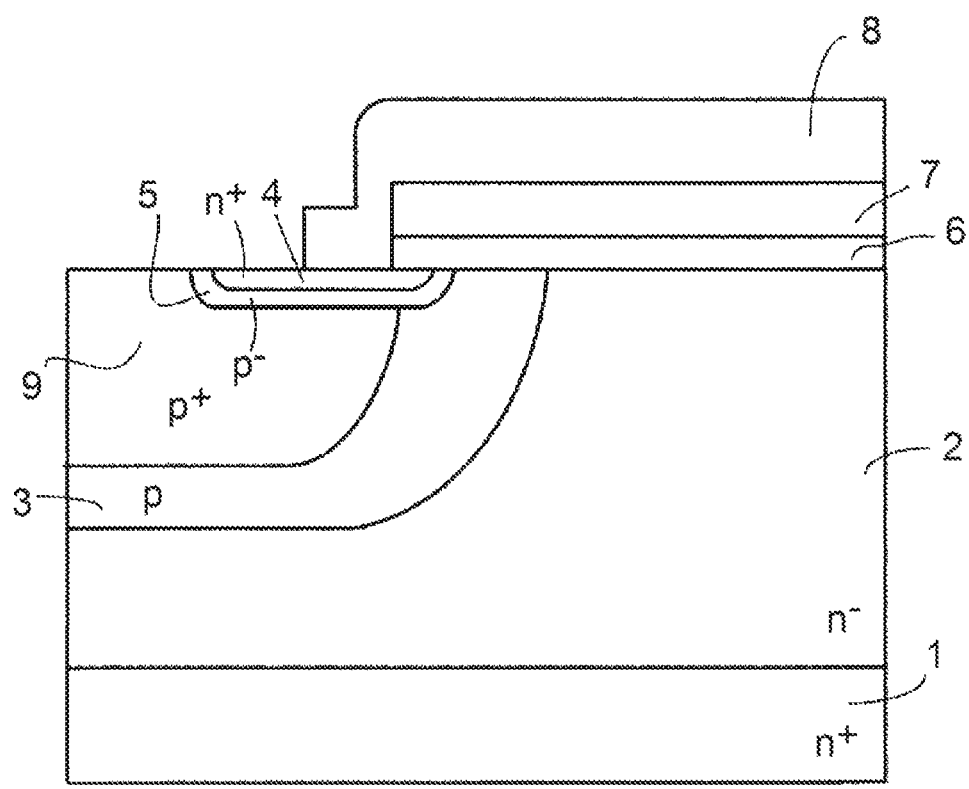
FIG. 22 is a cross-sectional diagram of substantial parts of the semiconductor substrate, showing sequentially the steps of manufacturing the surface MOS structure of the MOSFET according to Embodiment 2 of the present invention (8)
Figure 23:
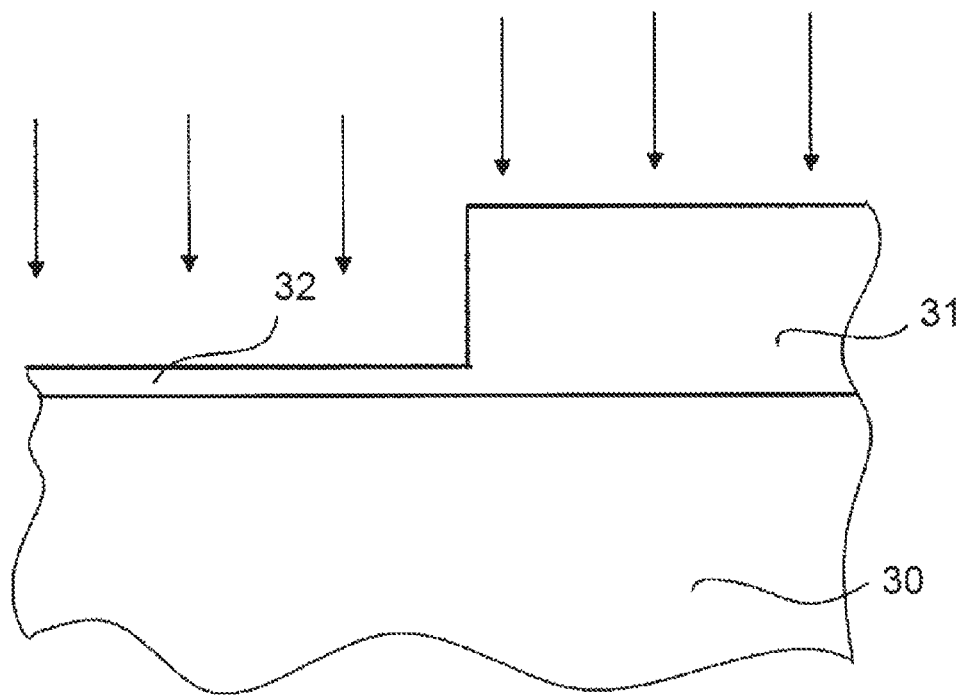
FIG. 23 is a cross-sectional diagram of substantial parts of a semiconductor substrate, showing sequentially the steps of manufacturing a surface MOS structure of a conventional MOSFET (1)
Figure 24:
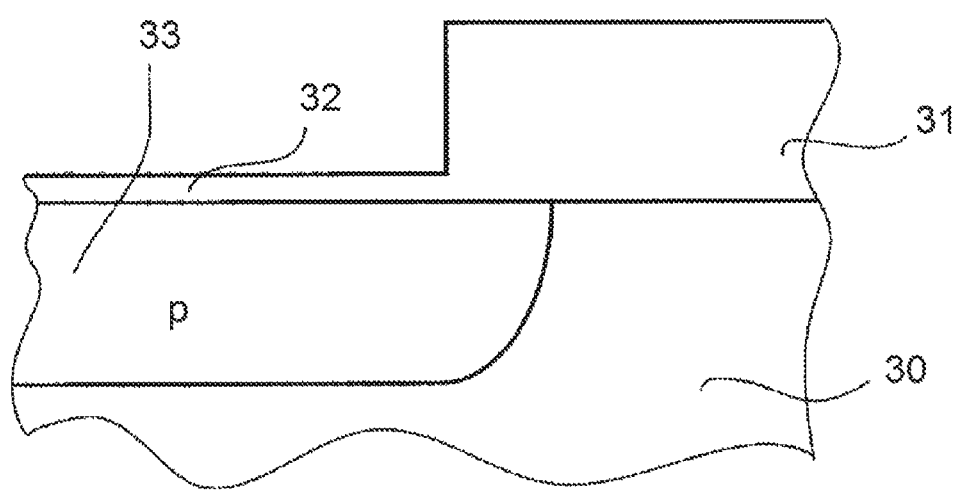
FIG. 24 is a cross-sectional diagram of substantial parts of the semiconductor substrate, showing sequentially the steps of manufacturing the surface MOS structure of the conventional MOSFET (2)
Figure 25:
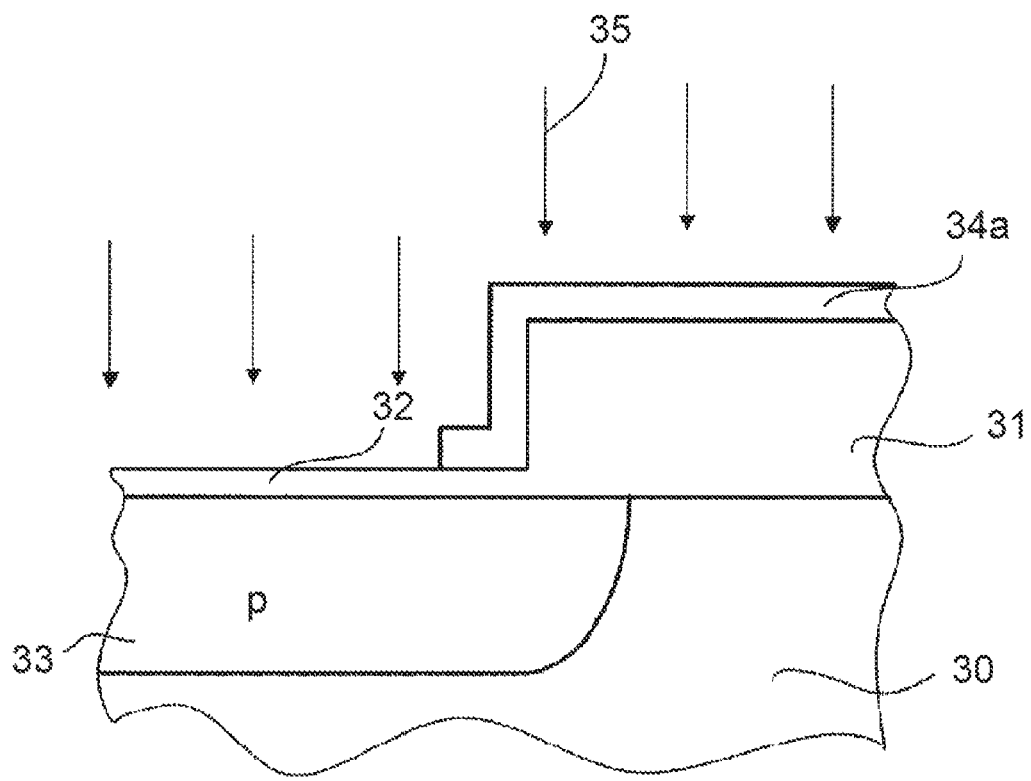
FIG. 25 is a cross-sectional diagram of substantial parts of the semiconductor substrate, showing sequentially the steps of manufacturing the surface MOS structure of the conventional MOSFET (3)
Figure 26:
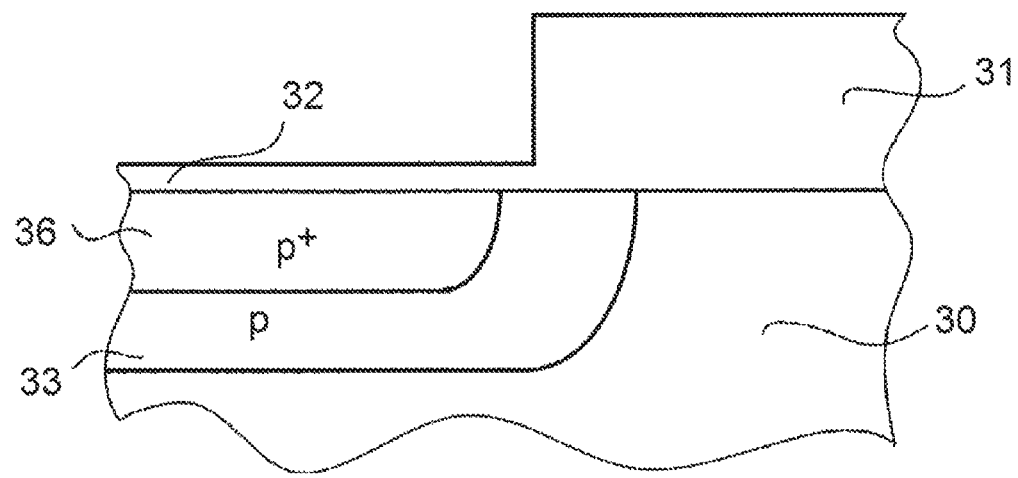
FIG. 26 is a cross-sectional diagram of substantial parts of the semiconductor substrate, showing sequentially the steps of manufacturing the surface MOS structure of the conventional MOSFET (4)
Figure 27:
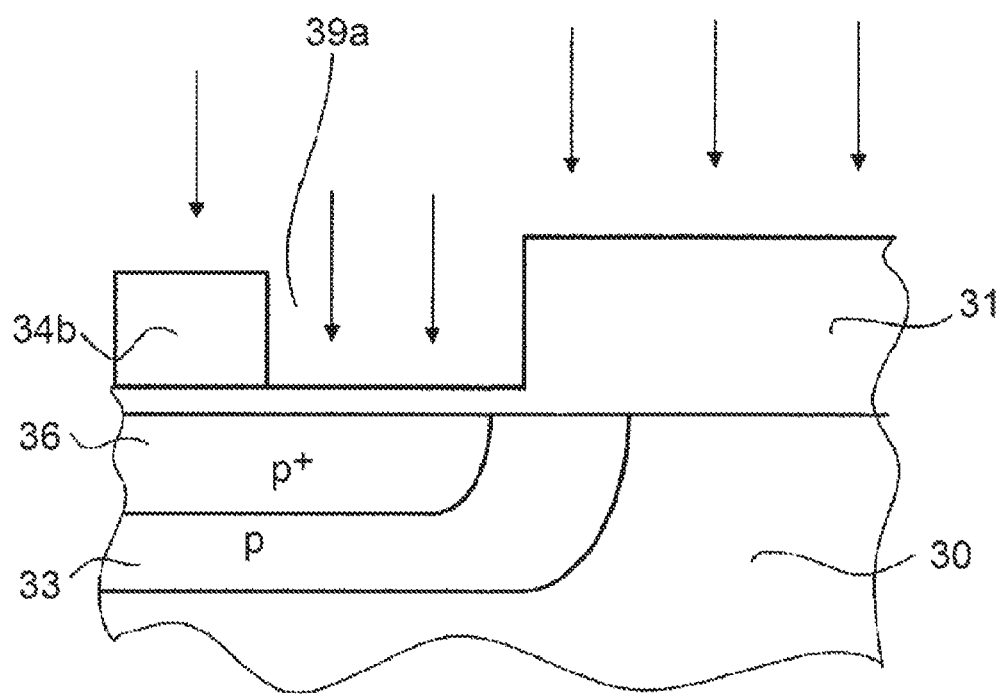
FIG. 27 is a cross-sectional diagram of substantial parts of the semiconductor substrate, showing sequentially the steps of manufacturing the surface MOS structure of the conventional MOSFET (5)
Figure 28:
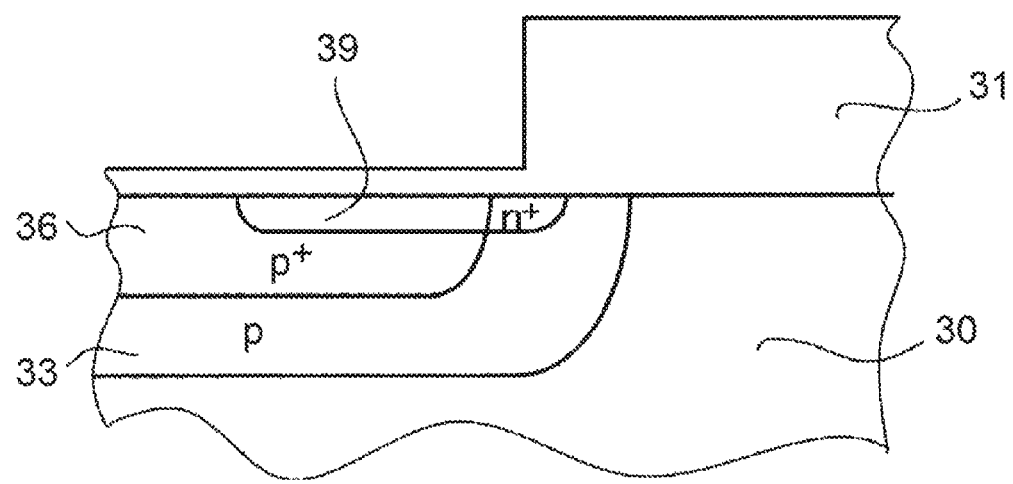
FIG. 28 is a cross-sectional diagram of substantial parts of the semiconductor substrate, showing sequentially the steps of manufacturing the surface MOS structure of the conventional MOSFET (6)
Figure 29:
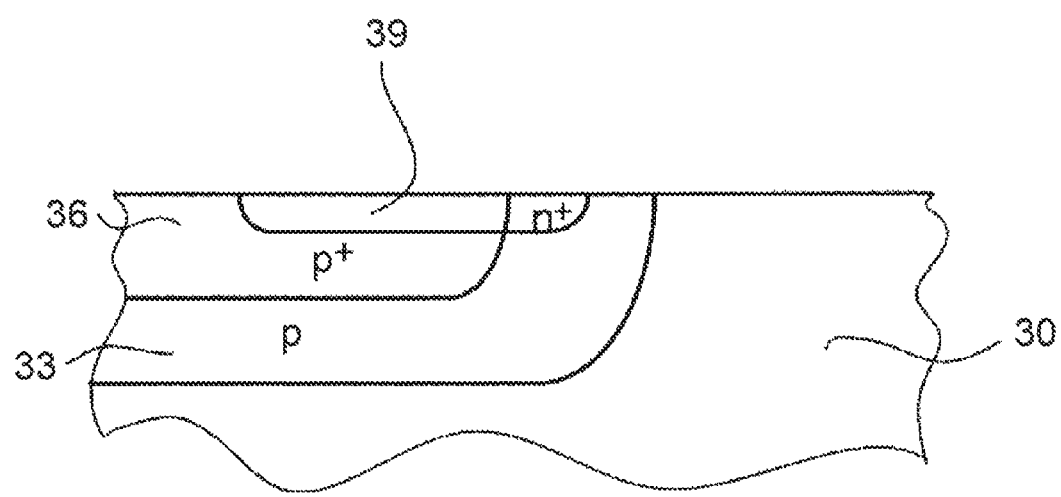
FIG. 29 is a cross-sectional diagram of substantial parts of the semiconductor substrate, showing sequentially the steps of manufacturing the surface MOS structure of the conventional MOSFET (7)
Figure 30:
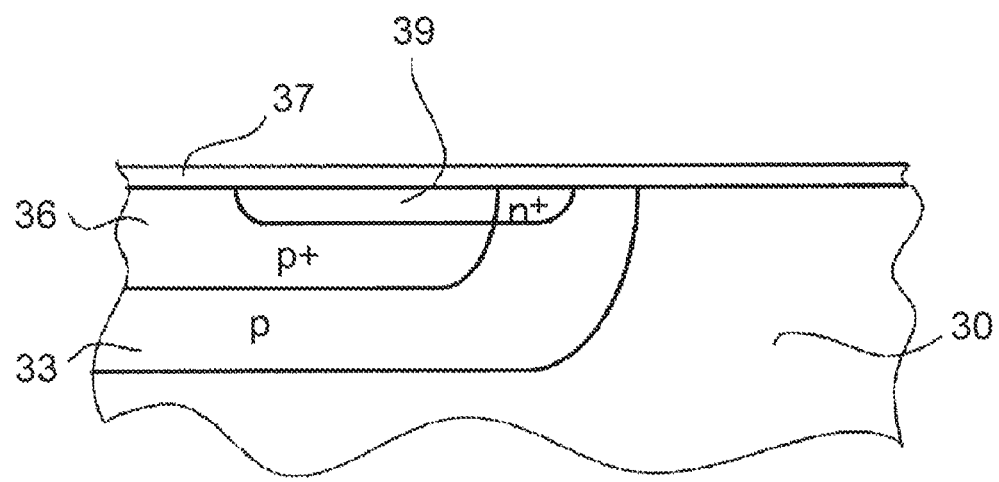
FIG. 30 is a cross-sectional diagram of substantial parts of the semiconductor substrate, showing sequentially the steps of manufacturing the surface MOS structure of the conventional MOSFET (8)
Figure 31:
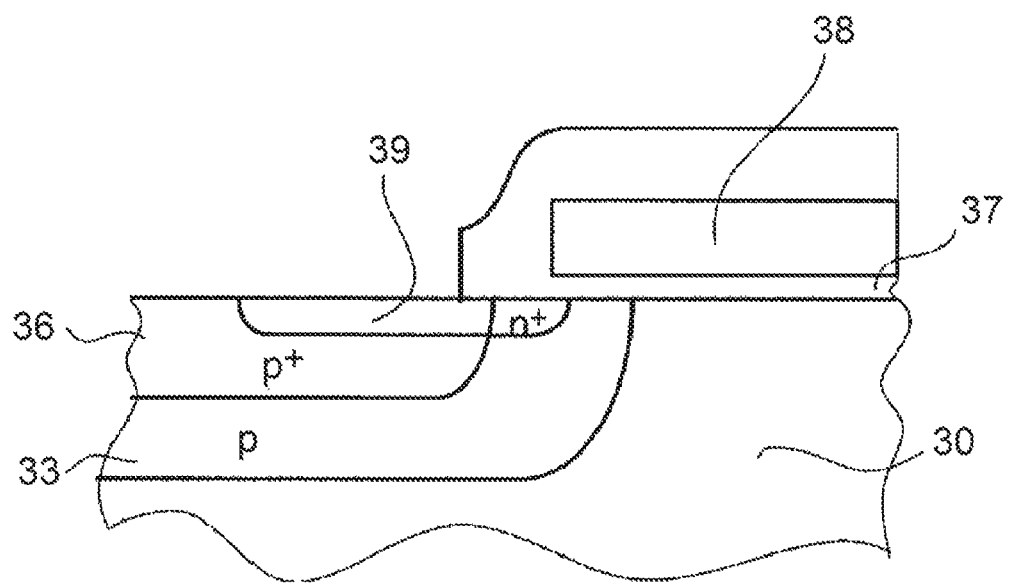
FIG. 31 is a cross-sectional diagram of substantial parts of the semiconductor substrate, showing sequentially the steps of manufacturing the surface MOS structure of the conventional MOSFET (9)
Figure 32:
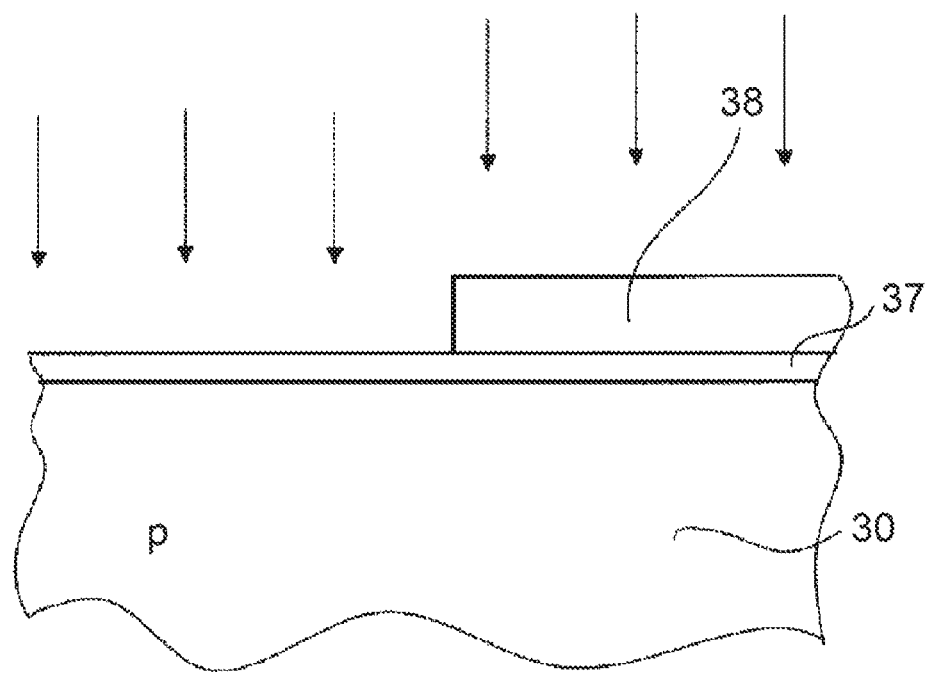
FIG. 32 is a cross-sectional diagram of substantial parts of a semiconductor device, showing sequentially the other examples of steps of manufacturing a surface MOS structure of a conventional MOSFET (1)
Figure 33:
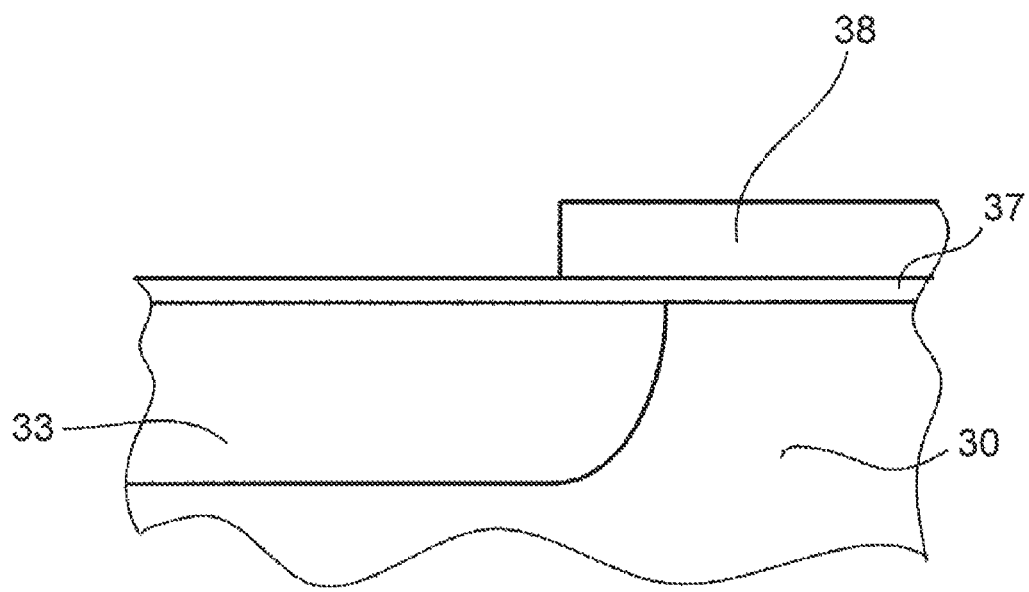
FIG. 33 is a cross-sectional diagram of substantial parts of the semiconductor device, showing sequentially the other examples of steps of manufacturing the surface MOS structure of the conventional MOSFET (2)
Figure 34:
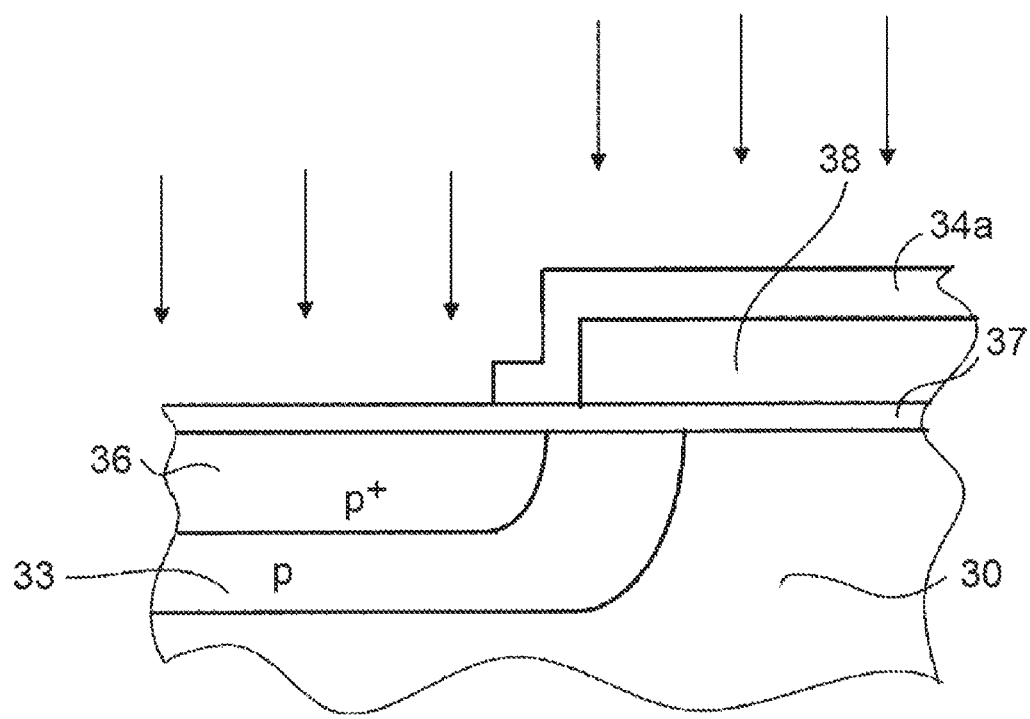
FIG. 34 is a cross-sectional diagram of substantial parts of the semiconductor device, showing sequentially the other examples of steps of manufacturing the surface MOS structure of the conventional MOSFET (3)
Figure 35:
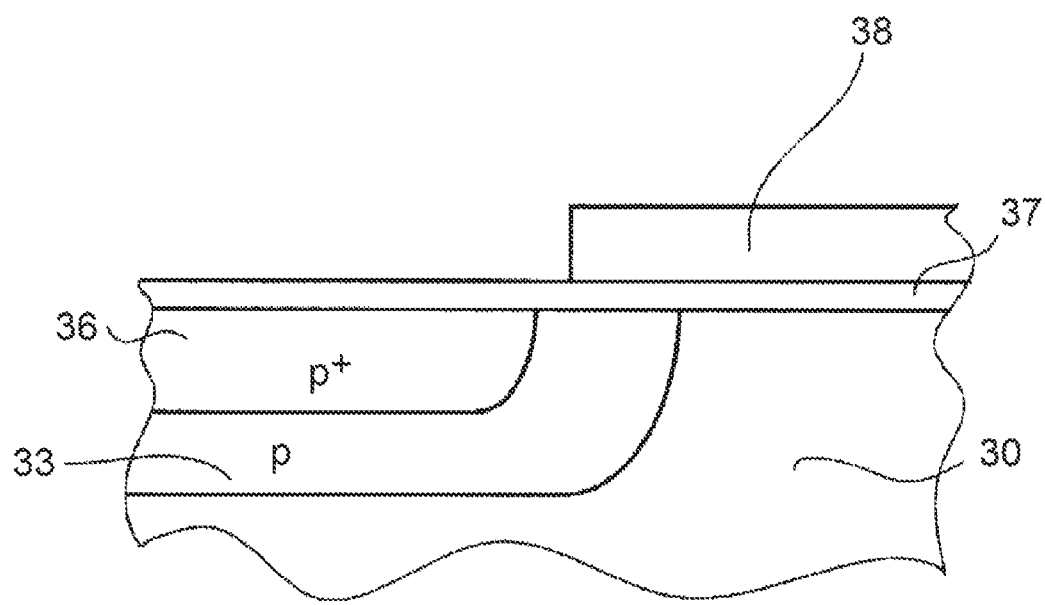
FIG. 35 is a cross-sectional diagram of substantial parts of the semiconductor device, showing sequentially the other examples of steps of manufacturing the surface MOS structure of the conventional MOSFET (4)
Figure 36:
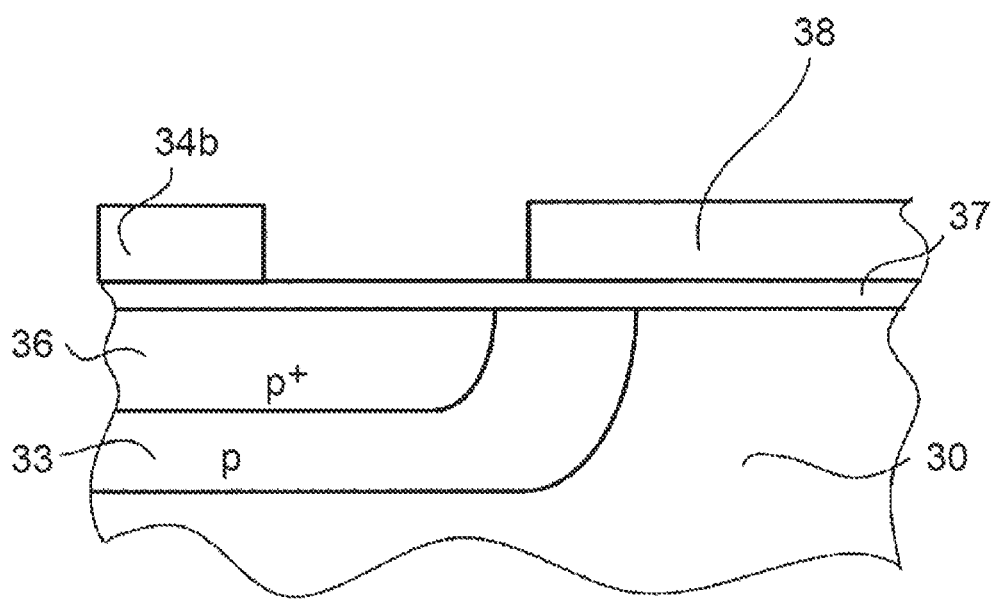
FIG. 36 is a cross-sectional diagram of substantial parts of the semiconductor device, showing sequentially the other examples of steps of manufacturing the surface MOS structure of the conventional MOSFET (5)
Figure 37:
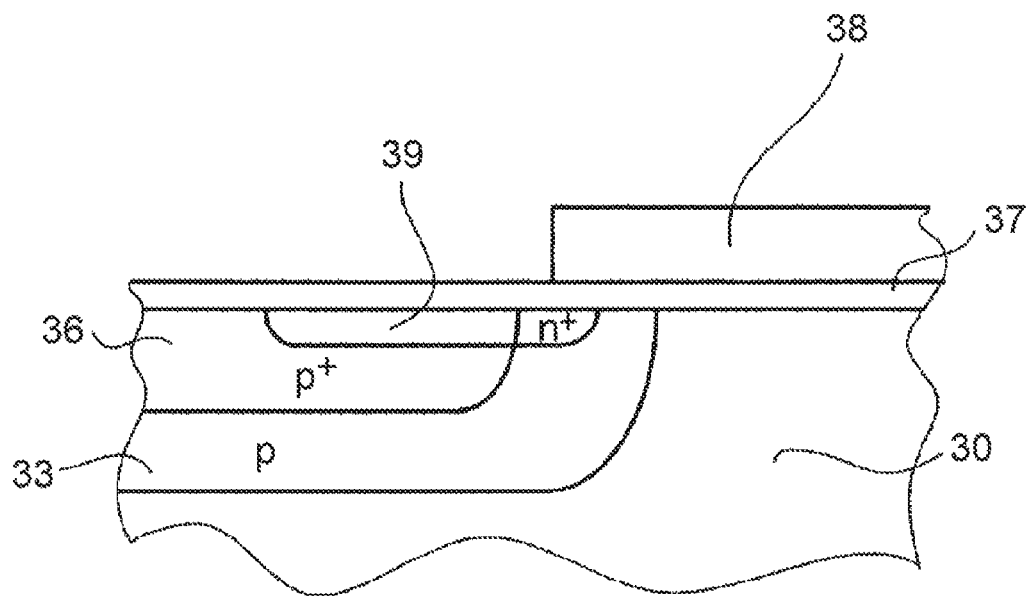
FIG. 37 is a cross-sectional diagram of substantial parts of the semiconductor device, showing sequentially the other examples of steps of manufacturing the surface MOS structure of the conventional MOSFET (6)
Figure 38:
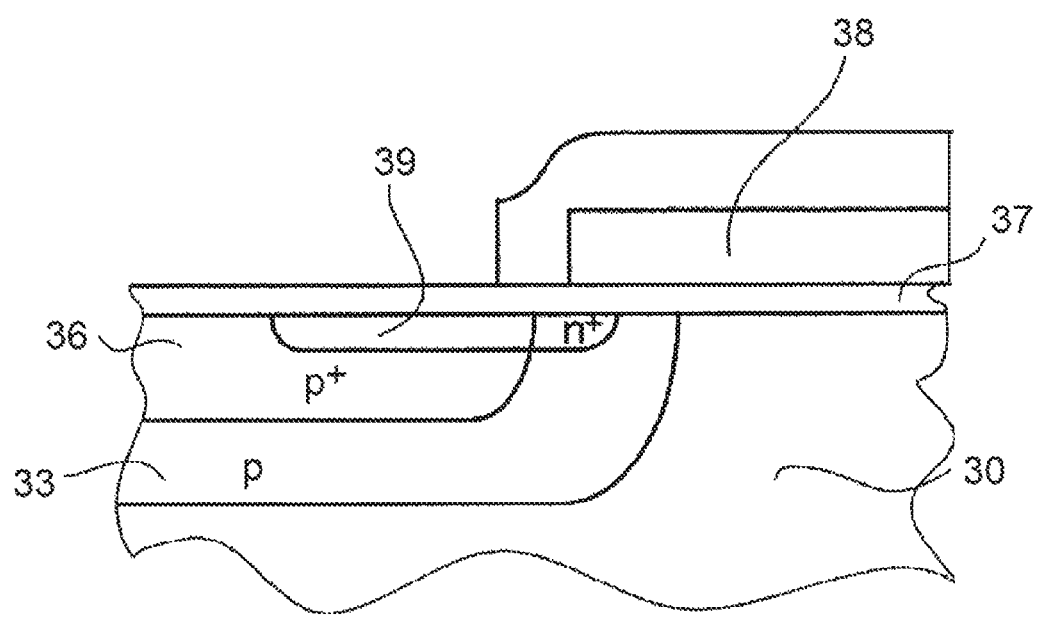
FIG. 38 is a cross-sectional diagram of substantial parts of the semiconductor device, showing sequentially the other examples of steps of manufacturing the surface MOS structure of the conventional MOSFET (7)

Subsequently, an insulator is formed and patterned by means of photolithography and etching, to form an interlayer insulator 8. As a result, a cell structure of the MOSFET including the surface MOS structure is formed. By executing the same subsequent steps as those described in Embodiment 1, a vertical n-channel MOSFET is completed (FIG. 22). According to the steps of manufacturing a MOSFET according to Embodiment 2 illustrated herein, the phosphorus ions having a diffusion coefficient larger than that of the arsenic ions forming the $n^+$-type source region 4 are diffused around the $n^+$-type source region 4 in the p-type well region 3. For this reason, the net doping concentration in a part of the p-type well region 3 that is in the vicinity of the $n^+$-type source region 4 becomes lower than the boron concentration in a part of the p-type well region 3 that is distant from the $n^+$-type source region 4, forming the $p^-$ region 5. According to these steps, the p-type well region 3 and the $n^+$-type source region 4 are formed by self-alignment.

As with Embodiment 1, Embodiment 2 described above can produce a MOSFET having a thick gate insulator and large gate breakdown withstand capability, without increasing the gate threshold voltage. In addition, as with Embodiment 1, Embodiment 2 can also form the p-type well region and the $n^+$-type source region 4 by self-alignment in a high-precision positional relationship.

Embodiment 3

Next is described a method for manufacturing a semiconductor device according to Embodiment 3 of the present invention, with reference to an example of manufacturing an n-channel MOSFET. FIGS. 39 to 42 are cross-sectional diagrams of substantial parts of a semiconductor substrate, each showing sequentially the steps of manufacturing a surface MOS structure of a MOSFET according to Embodiment 3 of the present invention. The difference between the method for manufacturing a semiconductor device according to Embodiment 3 and the method for manufacturing a semiconductor device according to Embodiment 1 is that different resist masks are used to perform arsenic ion implantation 16 and phosphorus ion implantation 17. Specifically, the width of an $n^+$-type source region 24 is made narrower than the width of a $p^-$ region 25 by narrowing the width of the opening between a resist mask and the oxide mask of the field oxide film 11 during the arsenic ion implantation 16 than in phosphorus ion implantation 17.

Figure 39:
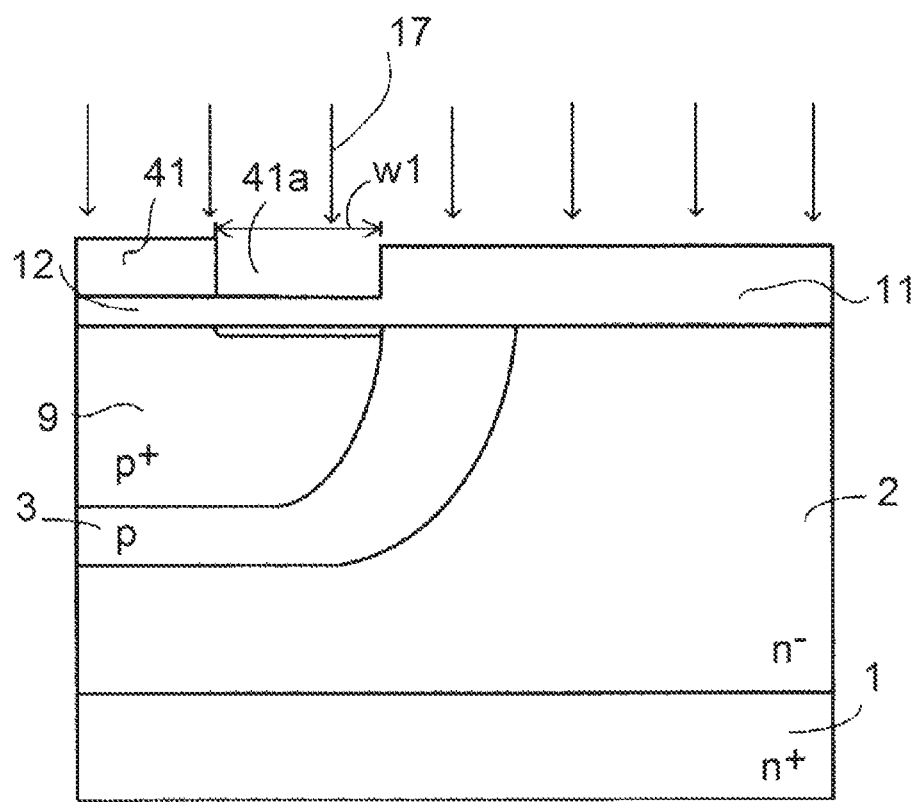
FIG. 39 is a cross-sectional diagram of substantial parts of a semiconductor substrate, showing sequentially the steps of manufacturing a surface MOS structure of a MOSFET according to Embodiment 3 of the present invention (1)

More specifically, first of all, similarly to Embodiment 1 the p-type well region 3 is selectively formed on the surface layer of the front surface (the surface on the $n^-$ layer 2 side) of a silicon substrate configured by stacking an $n^+$ layer 1 and the $n^-$ layer 2, and thereafter a $p^+$ contact region 9 is selectively formed inside the p-type well region 3 (FIGS. 7 to 10). A first resist mask 41 is formed in such a manner that the area for forming a $p^-$ region 25 is exposed on a first opening 41a between the first resist mask 41 and the oxide mask of the field oxide film 11. Next, masking with the first resist mask 41 and the field oxide film 11, phosphorus ion implantation 17 is carried out at appropriate energy to implant phosphorus ions through the screen oxide film 12 exposed on the first opening 41a between the first resist mask 41 and the oxide mask of the field oxide film 11 (FIG. 39). Subsequently, the first resist mask 41 is peeled off.

Figure 40:
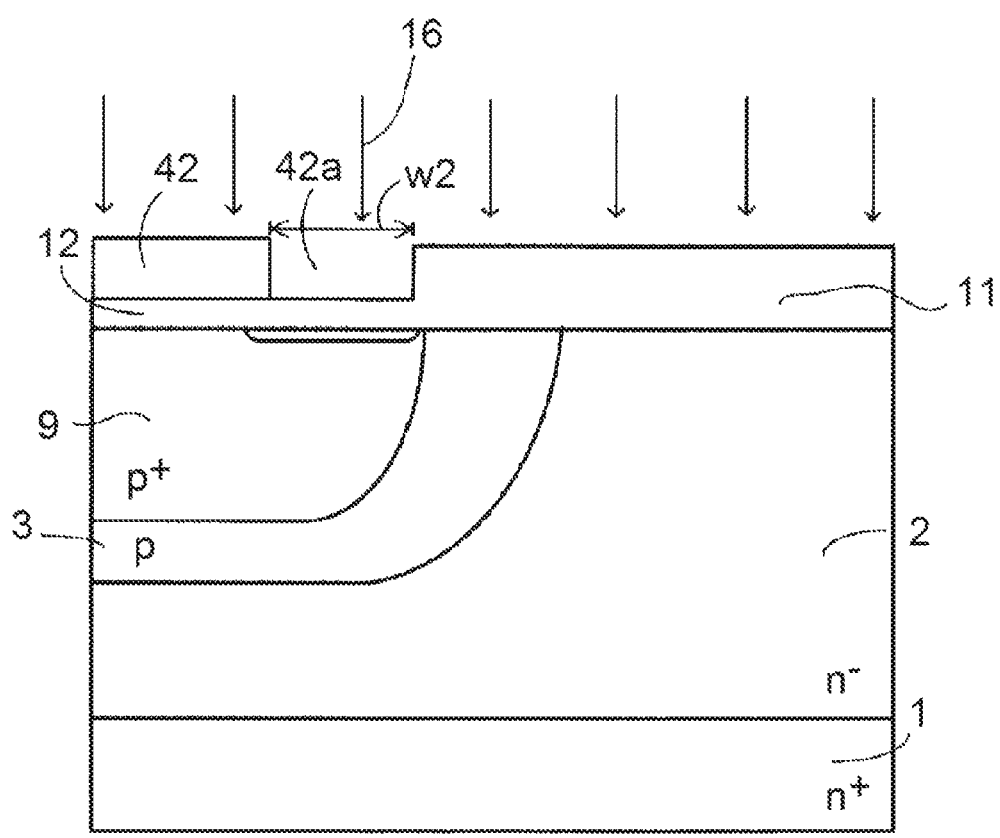
FIG. 40 is a cross-sectional diagram of substantial parts of the semiconductor substrate, showing sequentially the steps of manufacturing the surface MOS structure of the MOSFET according to Embodiment 3 of the present invention (2)

Subsequently, a second resist mask 42 is formed in such a manner that the area for forming the $n^+$-type source region 24 is exposed on a second opening 42a between the second resist mask 42 and the oxide mask of the field oxide film 11. In so doing, a second opening width w2 of the second opening 42a between the second resist mask 42 and the oxide mask of the field oxide film 11 is made narrower than a first opening width w1 of the first opening 41a between the first resist mask 41 and the oxide mask of the field oxide film 11 in order to form the $p^-$ region 25 (w1>w2). Next, masking with the second resist mask 42 and the field oxide film 11, arsenic ion implantation 16 is carried out at appropriate energy to implant arsenic ion through the screen oxide film 12 exposed on the second opening 42a between the second resist mask 42 and the oxide mask of the field oxide film 11 (FIG. 40). Then, the second resist mask 42 is peeled off.

Figure 41:
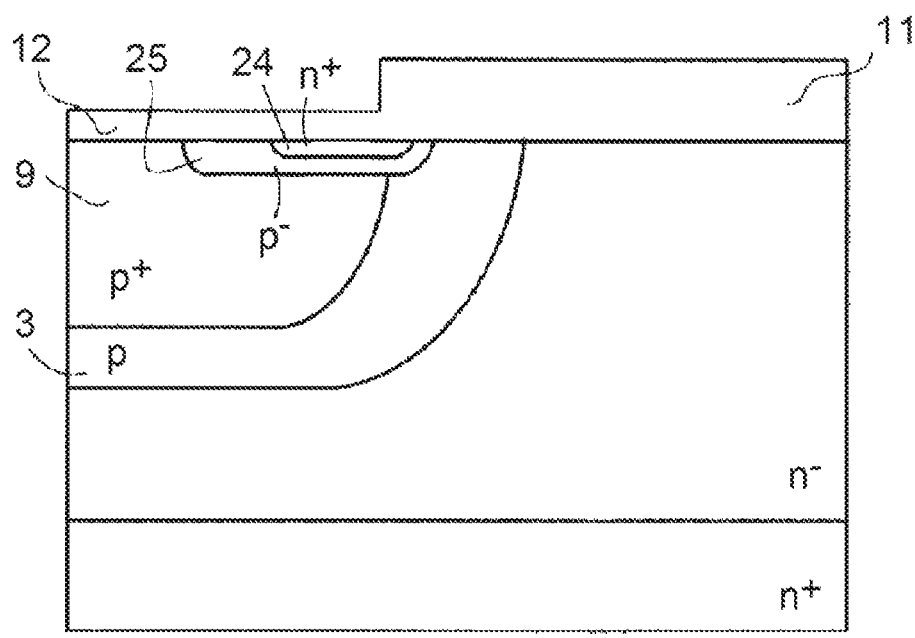
FIG. 41 is a cross-sectional diagram of substantial parts of the semiconductor substrate, showing sequentially the steps of manufacturing the surface MOS structure of the MOSFET according to Embodiment 3 of the present invention (3)
Figure 42:
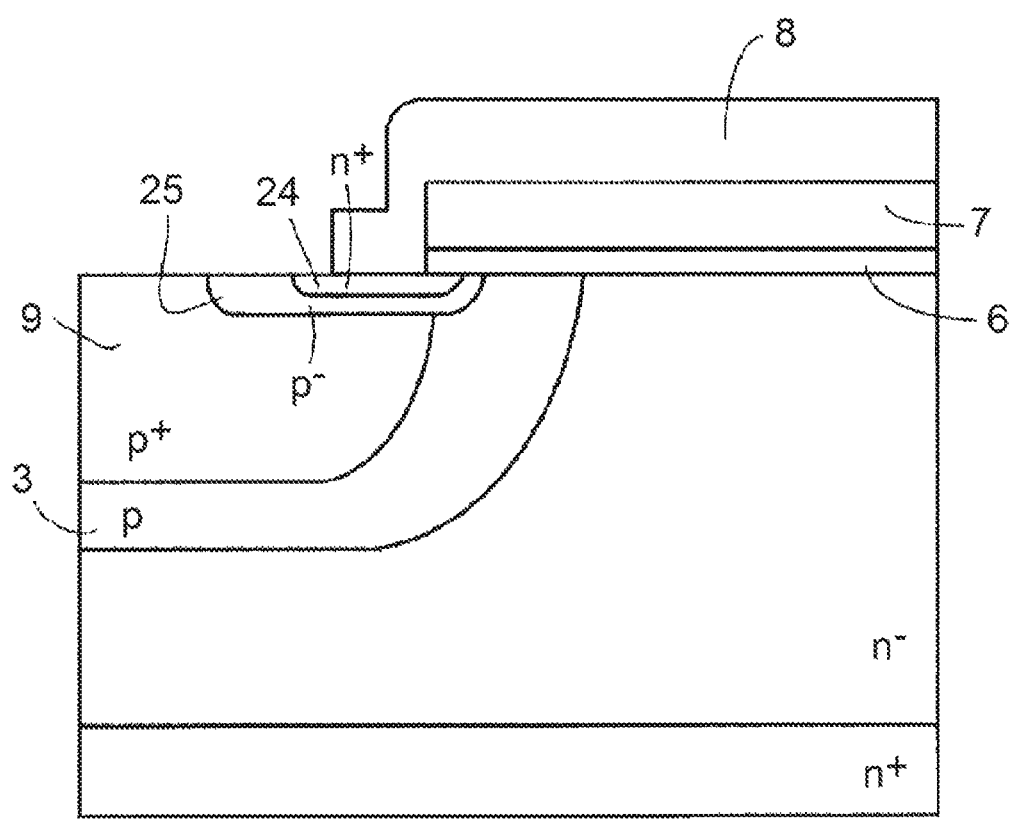
FIG. 42 is a cross-sectional diagram of substantial parts of the semiconductor substrate, showing sequentially the steps of manufacturing the surface MOS structure of the MOSFET according to Embodiment 3 of the present invention (4).

Thereafter, the implanted arsenic and phosphorus are annealed. As a result, the $n^+$-type source region 24 and the $p^-$ region 25 in which the impurity concentration is compensated by the doped phosphorus are formed, in the same manner as Embodiment 1. Because the second opening width w2 of the second opening 42a obtained during the arsenic ion implantation 16 is narrower than the first opening width w1 of the first opening 41a obtained during the phosphorus ion implantation 17 as described above, the area into which arsenic ions are implanted by the arsenic ion implantation 16 is narrower than the area into which phosphorus ions are implanted by the phosphorus ion implantation 17, when carrying out the arsenic ion implantation 16 and the phosphorus ion implantation 17 using the same resist mask (when the width of the area into which arsenic ions are implanted by the arsenic ion implantation 16 is equal to the width of the area into which phosphorus ions are implanted by phosphorus ion implantation 17). For this reason, the width of the $n^+$-type source region 24 is narrower than the width $p^-$ region 25, compared to when carrying out arsenic ion implantation 16 and phosphorus ion implantation 17 using the same resist mask (FIG. 41).

Making the width of the $n^+$-type source region 24 narrower than that of the $p^-$ region 25 can reduce the ratio of the n-type impurity concentration in the $n^+$-type source region 24 to the p-type impurity concentration in the p-type well region 3. Therefore, even when the impurity concentration in the p-type well region 3 is reduced by forming the p⁻ region 25, a short channel effect is made unlikely, and operation of parasitic bipolar transistors can be prevented. Subsequently, as in Embodiment 1, the rest of the components of the surface MOS structure such as the gate insulator 6, the gate electrode 7, and the interlayer insulator 8 are formed (FIG. 42), and then a source and drain electrodes, not shown, are formed, completing an n-channel MOSFET.

Although not particularly limited, the sizes of the components and the impurity concentrations may assume the following values. The thickness of the n⁺ layer 1 is approximately 3 µm to 50 µm. The impurity concentration in the n⁺ layer 1 is approximately $6.0 \times 10^{17}$ atoms/cm³ to $7.0 \times 10^{17}$ atoms/cm³. The thickness of the n⁻ layer 2 is approximately 3 µm to 50 µm. The impurity concentration in the n⁻ layer 2 is approximately $8.5 \times 10^{13}$ atoms/cm³ to 7.8 to $10^{16}$ atoms/cm³. The thickness of the p-type well region 3 is approximately 1 µm to 10 µm. The impurity concentration in the p-type well region 3 is approximately $1.0 \times 10^{16}$ atoms/cm³ to $5.0 \times 10^{18}$ atoms/cm³. The thickness of the n⁺-type source region 24 is approximately 0.1 µm to 2.0 µm. The impurity concentration in the n⁺-type source region 24 is approximately $1.0 \times 10^{19}$ atoms/cm³ to $1.0 \times 10^{22}$ atoms/cm³.

The thickness of the p⁻ region 25 is approximately 1 µm to 10 µm. The thickness of the p⁻ region 25 is equal to the thickness in the depth direction of the section sandwiched between the n⁺-type source region 24 and the p-type well region 3. The impurity concentration in the p⁻ region 25 is approximately $1.0 \times 10^{15}$ atoms/cm³ to $5.0 \times 10^{18}$ atoms/cm³. The thickness of the gate insulator 6 is 100 Å to 2000 Å. The length of the channel forming region 10 in the p-type well region 3 (the distance between the n⁺-type source region 24 and the surface layer of the n⁻ layer 2 in the p-type well region 3: channel length) may be at least, for example, 1.5 µm. Because the p-type impurity concentration in a part of the surface layer of the p-type well region 3 which is adjacent to the n⁺-type source region 24 becomes lower than the impurity concentrations in the other parts of the p-type well region 3, a depletion layer extending from a pn junction between the p-type well region 3 and the n⁻ layer 2 does not punch through into the n⁺-type source region 24 when the semiconductor device is ON. This is why the length of the channel length may be at least 1.5 µm. Specifically, when the channel length is, for example, 1.5 µm, the depletion layer spreads to the inside of the channel forming region 10 by 1.0 µm, and the width of the section in the p⁻ region 25, sandwiched between the n⁺-type source region 24 and the depletion layer (i.e., the section to which the depletion layer does not spread) is 0.5 µm.

The method for manufacturing a semiconductor device according to Embodiment 3 described above may be applied to the method for manufacturing a semiconductor device according to Embodiment 2 to use the gate electrode as an ion implantation mask, in place of a field oxide film. In this case, the gate insulator and the gate electrode are formed on the front surface of the silicon substrate after forming the p-type well region 3 and prior to forming the n⁺-type source region 24 and the p⁻ region 25. Then, masking with the first resist mask 41 and the field oxide film 11, phosphorus ion implantation 17 may be carried out to implant phosphorus ions through the gate insulator exposed on the first opening 41a, and thereafter the first resist mask 41 may be peeled off. Then, masking with the second resist mask 42 and the field oxide film 11, arsenic ion implantation 16 may be carried out to implant arsenic ions through the gate insulator exposed on the second opening 42a.

According to Embodiment 3 described above, arsenic ion implantation for forming the n⁺-type source region and phosphorus ion implantation for forming the p⁻ region are carried out using the same field oxide film or gate electrode as an ion implantation mask. This means that, even when the area for implanting arsenic ions is made narrower than the area for implanting phosphorus ions by forming different resist masks at the time of arsenic ion implantation and at the time of phosphorus ion implantation, the n⁺-type source region and the p⁻ region can be formed by self-alignment, achieving the same effects as those of Embodiment 1.

Each of these embodiments was described with an n-channel MOSFET as an example but can also be used as a p-channel MOSFET or IGBT. In addition, each of the embodiments was described with an example of forming the n⁺-type source region by means of arsenic ion implantation and forming the p⁻ region by means of phosphorus ion implantation; however, the p impurity concentration in the p-type well region may be reduced using n-type ionic species having a larger diffusion coefficient than ion species used for forming the n⁺-type source region, to form the p⁻ region. Thus, the type of n-type impurity ions to be implanted can variously be changed.

EXPLANATION OF REFERENCE NUMERALS

1 n⁺ layer
2 n⁻ layer
3, 33 p-type well region
4, 24, 39 n⁺-type source region
5, 25 p⁻ region
6, 37 Gate insulator
7, 38 Gate electrode
8 Interlayer insulator
9, 36 p⁺ contact region
10 Channel forming region
11 Field oxide film
11a Opening of oxide film of field oxide film 11
12, 32 Screen oxide film
13a, 13b, 35 Boron ion implantation
14, 15, 34a, 34b, 41, 42 Resist mask
15a, 39a, 41a, 42a Opening between field oxide film or gate electrode and resist mask
16 Arsenic ion implantation
17 Phosphorus ion implantation
30 n-type silicon substrate
31 Insulator

What is claimed is:

1. A method for manufacturing a semiconductor device, the method comprising:
   a first forming step of selectively forming an insulator on one of main surfaces of a first conductivity-type semiconductor substrate constituting a first conductivity-type drift layer;
   a second forming step of selectively forming a second conductivity-type well region on one of the main surfaces of the first conductivity-type semiconductor substrate by implanting ions of a second conductivity-type impurity, with the insulator serving as a mask, and diffusing the second conductivity-type impurity by heat treatment;
   a first mask forming step of forming a first resist mask that has a first opening for selectively exposing the second conductivity-type well region between the insulator and the first resist mask;
   an ion implantation step of ion-implanting successively two types of first conductivity-type impurities having mutually different diffusion coefficients, into the second conductivity-type well region through the first opening by using the insulator and the first resist mask as masks;

an annealing step of forming a first conductivity-type source region and a second conductivity-type low-impurity-concentration region by diffusing the two types of first conductivity-type impurities having mutually different diffusion coefficients by means of annealing;

a third forming step of forming a gate insulator on one of the main surfaces of the first conductivity-type semiconductor substrate; and a fourth forming step of forming a gate electrode on surfaces of the first conductivity-type source region, the second conductivity-type low-impurity-concentration region, the second conductivity-type well region, and the first conductivity-type drift layer, with the gate insulator interposed between the gate electrode and the surfaces.

2. The method for manufacturing a semiconductor device according to claim 1, wherein the ion implantation step includes:

a first ion implantation step ion-implanting the first conductivity-type impurity having a larger diffusion coefficient, out of the two types of first conductivity impurities having mutually different diffusion coefficients, into the second conductivity-type well region through the first opening, with the insulator and the first resist mask serving as masks;

a second mask forming step of, after removing the resist mask, forming a second resist mask that has a second opening for selectively exposing the second conductivity-type well region between the insulator and the second resist mask, with the second opening being formed to have an opening width narrower than an opening width of the first opening; and a second ion implantation step of ion-implanting a type having a smaller diffusion coefficient, out of the two types of first conductivity impurities having mutually different diffusion coefficients, into the second conductivity-type well region through the second opening, with the insulator and the second resist mask serving as masks.

3. The method for manufacturing a semiconductor device according to claim 2, wherein out of the two types of first conductivity impurities having mutually different diffusion coefficients, a type having a larger diffusion coefficient is phosphorus.

4. The method for manufacturing a semiconductor device according to claim 2, wherein an ion-implantation dosage of ions of a type of the two types of the first conductivity-type impurities having a larger diffusion coefficient is less than an ion-implantation dosage of ions of the second conductivity-type impurity.

5. The method for manufacturing a semiconductor device according to claim 1, wherein out of the two types of first conductivity impurities having mutually different diffusion coefficients, a type having a larger diffusion coefficient is phosphorus.

6. The method for manufacturing a semiconductor device according to claim 1, wherein an ion-implantation dosage of ions of a type of the two types of the first conductivity-type impurities having a larger diffusion coefficient is less than an ion-implantation dosage of ions of the second conductivity-type impurity.

7. A method for manufacturing a semiconductor device, the method comprising:

a first forming step of forming a gate insulator on one of main surfaces of a first conductivity-type semiconductor substrate;

a second forming step of forming a gate electrode on a surface of the gate insulator by patterning a polysilicon film;

a third forming step of selectively forming a second conductivity-type well region on one of the main surfaces of the first conductivity-type semiconductor substrate by ion-implanting a second conductivity-type impurity, with the gate electrode serving as a mask, and diffusing the second conductivity-type impurity by heat;

a first mask forming step of forming a first resist mask that has a first opening for selectively exposing the second conductivity-type well region between the gate electrode and the first resist mask;

an ion implantation step of ion-implanting two types of first conductivity-type impurities having mutually different diffusion coefficients, into the second conductivity-type well region through the first opening by using the gate electrode and the first resist mask as masks; and a fourth forming step of forming a first conductivity-type source region and a second conductivity-type low-impurity-concentration region by diffusing the two types of first conductivity-type impurities having mutually different diffusion coefficients by means of annealing.

8. The method for manufacturing a semiconductor device according to claim 7, wherein the ion implantation step includes:

a first ion implantation step of ion-implanting the first conductivity-type impurity having a larger diffusion coefficient, out of the two types of first conductivity impurities having mutually different diffusion coefficients, into the second conductivity-type well region through the first opening, with the gate electrode and the first resist mask serving as masks;

a second mask forming step of forming, after removing the first resist mask, a second resist mask that has a second opening for selectively exposing the second conductivity-type well region between the gate electrode and the second resist mask, the second opening having an opening width narrower than an opening width of the first opening;

a second ion implantation step of ion-implanting a type having a smaller diffusion coefficient, out of the two types of first conductivity impurities having mutually different diffusion coefficients, into the second conductivity-type well region through the second opening, with the gate electrode and the second resist mask serving as masks.

9. The method for manufacturing a semiconductor device according to claim 8, wherein out of the two types of first conductivity impurities having mutually different diffusion coefficients, a type having a larger diffusion coefficient is phosphorus.

10. The method for manufacturing a semiconductor device according to claim 8, wherein an ion-implantation dosage of ions of a type of the two types of the first conductivity-type impurities having a larger diffusion coefficient is less than an ion-implantation dosage of ions of the second conductivity-type impurity.

11. The method for manufacturing a semiconductor device according to claim 7, wherein out of the two types of first conductivity impurities having mutually different diffusion coefficients, a type having a larger diffusion coefficient is phosphorus.

12. The method for manufacturing a semiconductor device according to claim 7, wherein an ion-implantation dosage of ions of a type of the two types of the first conductivity-type impurities having a larger diffusion coefficient is less than an ion-implantation dosage of ions of the second conductivity-type impurity.

* * * * *